US009721848B1

(12) United States Patent
Bu et al.

(10) Patent No.: US 9,721,848 B1
(45) Date of Patent: Aug. 1, 2017

(54) CUTTING FINS AND GATES IN CMOS DEVICES

(71) Applicant: INTERNATIONAL BUSINESS MACHINES CORPORATION, Armonk, NY (US)

(72) Inventors: Huiming Bu, Glenmont, NY (US); Kangguo Cheng, Schenectady, NY (US); Andrew M. Greene, Albany, NY (US); Dechao Guo, Niskayuna, NY (US); Sivananda K. Kanakasabapathy, Niskayuna, NY (US); Gauri Karve, Cohoes, NY (US); Balasubramanian S. Pranatharthiharan, Watervliet, NY (US); Stuart A. Sieg, Albany, NY (US); John R. Sporre, Albany, NY (US); Gen Tsutsui, Glenmont, NY (US); Rajasekhar Venigalla, Hopewell Junction, NY (US); Huimei Zhou, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/337,189

(22) Filed: Oct. 28, 2016

(51) Int. Cl.
| | |
|---|---|
| *H01L 21/8238* | (2006.01) |
| *H01L 29/66* | (2006.01) |
| *H01L 27/092* | (2006.01) |
| *H01L 29/08* | (2006.01) |
| *H01L 29/06* | (2006.01) |
| *H01L 29/78* | (2006.01) |

(52) U.S. Cl.
CPC ........ *H01L 21/823878* (2013.01); *H01L 21/823814* (2013.01); *H01L 21/823821* (2013.01); *H01L 27/0924* (2013.01); *H01L 29/0653* (2013.01); *H01L 29/0847* (2013.01); *H01L 29/66545* (2013.01); *H01L 29/7848* (2013.01)

(58) Field of Classification Search
CPC ..... H01L 21/823878; H01L 21/823814; H01L 21/823821; H01L 27/0924; H01L 29/0653; H01L 29/0847; H01L 29/66545; H01L 29/7848
See application file for complete search history.

(56) References Cited

U.S. PATENT DOCUMENTS

| | | | |
|---|---|---|---|
| 7,525,162 | B2 | 4/2009 | Yin et al. |
| 8,269,283 | B2 | 9/2012 | Cea et al. |
| 8,569,152 | B1 | 10/2013 | Basker et al. |
| 8,592,290 | B1 | 11/2013 | Basker et al. |
| 8,766,364 | B2 | 7/2014 | Doornbos et al. |
| 8,847,281 | B2 * | 9/2014 | Cea ................. H01L 29/66545 257/192 |

(Continued)

*Primary Examiner* — Karen Kusumakar
(74) *Attorney, Agent, or Firm* — Cantor Colburn LLP; Vazken Alexanian

(57) ABSTRACT

A semiconductor device includes a first fin and a second fin arranged on a substrate, a gate stack arranged over a channel region of the first fin, and spacers arranged along sidewalls of the gate stack. A cavity is arranged adjacent to a distal end of the gate stack. The cavity is defined by the substrate, a distal end of the second fin, and the spacers. A dielectric fill material is arranged in the cavity such that the dielectric fill material contacts the substrate, the distal end of the second fin, and the spacers.

20 Claims, 62 Drawing Sheets

(56) References Cited

U.S. PATENT DOCUMENTS

| | | |
|---|---|---|
| 9,064,932 B1 | 6/2015 | Pham et al. |
| 9,209,178 B2 | 12/2015 | Kanakasabapathy et al. |
| 9,263,287 B2 | 2/2016 | Tsao et al. |
| 9,263,340 B2 | 2/2016 | Taylor, Jr. et al. |
| 2014/0001572 A1* | 1/2014 | Bohr ............... H01L 21/823821 257/401 |
| 2014/0061780 A1* | 3/2014 | Son ................... H01L 21/28008 257/330 |
| 2015/0024572 A1* | 1/2015 | Jacob ............... H01L 21/76243 438/404 |
| 2015/0279959 A1* | 10/2015 | Qi ................... H01L 21/823431 438/585 |
| 2015/0318215 A1* | 11/2015 | Taylor, Jr. ......... H01L 21/30604 257/506 |

\* cited by examiner

CUTTING FINS AND GATES IN CMOS DEVICES

BACKGROUND

The present invention generally relates to complimentary metal-oxide semiconductors (CMOS) and metal-oxide-semiconductor field-effect transistors (MOSFET), and more specifically, to strain in semiconductor devices.

N-type field effect transistors (nFET) and p-type field effect transistors (pFET) are two types of complementary MOSFETs. The nFET, with n-doped source and drain junctions, uses electrons as the current carriers. The pFET, with p-doped source and drain junctions, uses holes as the current carriers.

Strain engineering is used to induce strain on the channel region of nFET and pFET devices. The strain can include a tensile strain or a compressive strain on the channel regions depending on the characteristics of the device. Crystalline materials such as crystalline silicon (c-Si) and crystalline silicon germanium (c-SiGe) are orientated in a lattice structure each with a different lattice constant (lattice parameter). Typically, during an epitaxial growth process where a seed layer has a lattice constant that is different from the grown material layer, a strain is induced in the grown material layer. For example, when silicon is grown on a relaxed silicon germanium layer a tensile strain is induced in the grown silicon layer.

SUMMARY

According to an embodiment of the present invention, a method for forming a semiconductor device includes forming a first fin and a second fin on a substrate, forming a sacrificial gate having a gate cap on the first fin and the second fin, and forming spacers adjacent to sidewalls of the sacrificial gate. A source/drain region is formed on exposed portions of the first fin and the second fin. An insulator layer is formed on the source/drain region. A sacrificial liner layer is formed on the sacrificial gate and the insulator layer. Portions of the sacrificial liner layer and portions of a gate cap are removed to expose portions of the sacrificial gate. Portions of the sacrificial gate and exposed portions of the second fin are removed to form a first cavity and a second cavity, where an exposed portion of the second fin is removed from the second cavity. A liner layer is deposited in the first cavity and the second cavity. Portions of the liner layer are removed in the second cavity to expose the substrate, and portions of the substrate in the second cavity are removed. A dielectric fill material is deposited in the first and second cavity. The sacrificial gate is removed, and a gate stack is formed over a channel region of the first fin.

According to another embodiment of the present invention, a method for forming a semiconductor device includes forming a first fin and a second fin on a substrate, forming a sacrificial gate on a channel region of the first fin and a channel region of the second fin, and forming spacers adjacent to sidewalls of the sacrificial gate. A source/drain region is formed on exposed portions of the first fin and the second fin. An insulator layer is formed on the source/drain region. The sacrificial gate is removed to form a cavity that exposes a channel region of the first fin and a channel region of the second fin. A gate dielectric layer is deposited in the cavity. A sacrificial liner layer is deposited on the gate dielectric layer. An amorphous semiconductor material is deposited on the sacrificial liner layer. A second sacrificial liner layer is deposited on the amorphous semiconductor material. Portions of the second sacrificial liner layer are removed to expose portions of the amorphous semiconductor material. Exposed portions of the amorphous semiconductor material, exposed portions of the second sacrificial liner layer, and exposed portions of the gate dielectric layer are removed. Exposed portions of the second fin and a portion of the substrate exposed following the removal of the exposed portions of the second fin are removed. An insulator material is deposited in the cavity.

According to yet another embodiment of the present invention, a semiconductor device includes a first fin and a second fin arranged on a substrate, a gate stack arranged over a channel region of the first fin, and spacers arranged along sidewalls of the gate stack. A cavity is arranged adjacent to a distal end of the gate stack. The cavity is defined by the substrate, a distal end of the second fin, and the spacers. A dielectric fill material is arranged in the cavity such that the dielectric fill material contacts the substrate, the distal end of the second fin, and the spacers.

BRIEF DESCRIPTION OF THE DRAWINGS

FIGS. 1-21C illustrate an exemplary method for forming FET devices.

FIG. 1 illustrates a side view of a wafer that includes a semiconductor substrate.

FIG. 10 illustrates a top view following the removal of the mask.

FIG. 21C illustrates a top view of the gate stacks.

FIGS. 22-29B illustrate another exemplary method for forming FET devices.

FIG. 22 illustrates a top view following the removal of the sacrificial gates (of FIG. 6B) to form cavities that expose channel regions of the fins.

FIG. 29B illustrates a cut-away view along the line D-D (of FIG. 29C) following the removal of the remaining amorphous semiconductor material (of FIGS. 28A and 28B) and the formation of a gate conductor.

DETAILED DESCRIPTION

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

The finFET is a type of MOSFET. The finFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device.

Gate spacers form an insulating film along the gate sidewalls. Gate spacers can also initially be formed along sacrificial gate sidewalls in replacement gate technology. The gate spacers are used to define source/drain regions in active areas of a semiconductor substrate located adjacent to the gate.

Device scaling drives the semiconductor industry, which reduces costs, decreases power consumption, and provides faster devices with increased functions per unit area. Improvements in optical lithography have played a major role in device scaling. However, optical lithography has limitations for minimum dimensions and pitch, which are determined by the wavelength of the irradiation.

As discussed above, the strain in the active regions of the semiconductor devices improves the performance of semiconductor devices. When a strained fin is cut to reduce the length of the strained fin, the strain can relax to an undesirable amount of strain. The methods and resultant structures described herein provide for substantially maintaining the strain on the fin following the cutting of the fin.

The embodiments described herein also provide for mitigating, reducing, or substantially preventing the undesirable shorting of the source/drain regions of a device during the epitaxial growth process used to form the source/drain regions. Such a short can occur when the source/drain regions are grown following the cutting of the sacrificial gate stacks. In such a method, the source/drain regions on opposing sides of the gate stack can undesirably grow together or short if the source/drain regions are grown such that they can connect adjacent to distal ends (tips) of the cut sacrificial (or replacement gate).

FIGS. 1-21C illustrate an exemplary method for forming FET devices.

Figure 1:
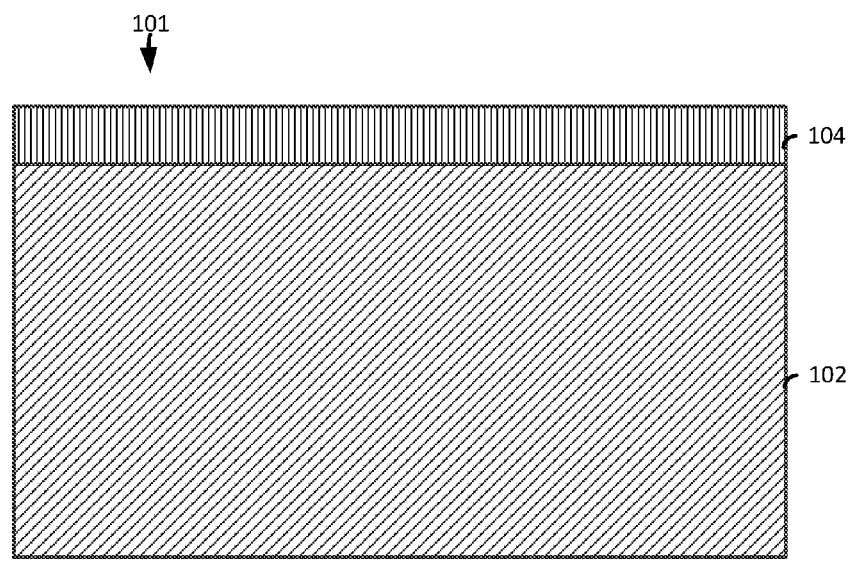

FIG. 1 illustrates a side view of a wafer 101 that includes a semiconductor substrate 102. A hardmask 104 arranged on the semiconductor substrate 102.

Non-limiting examples of suitable materials for the semiconductor substrate 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

A hardmask layer 104 is arranged on the semiconductor substrate 102. The hardmask 104 can include, for example, silicon oxide, silicon nitride (SiN), SiOCN, SiBCN or any suitable combination of those. The hardmask 104 can be deposited using a deposition process, including, but not limited to, PVD, CVD, PECVD, or any combination thereof.

Figure 2A:
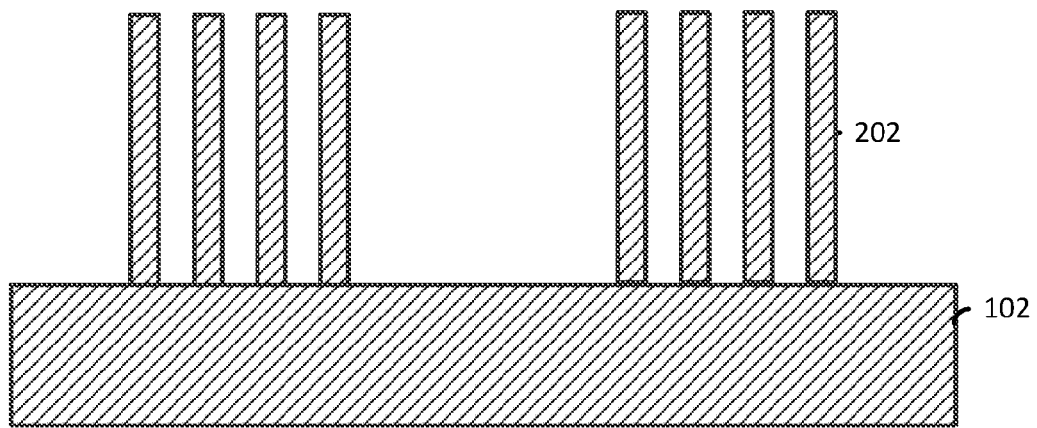
FIG. 2A illustrates a cut-away view along the line A-A (of FIG. 2B) following the patterning of fins.
Figure 2B:
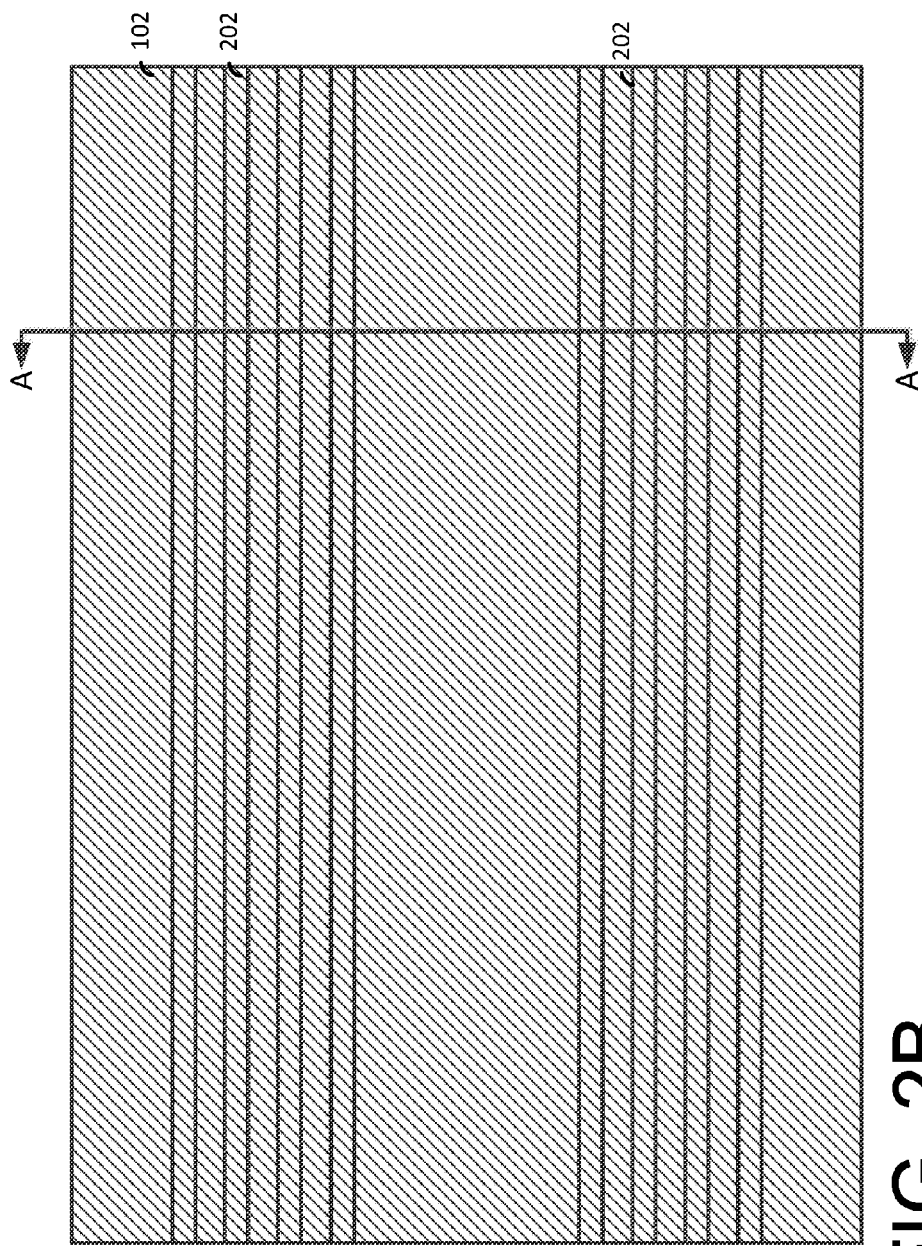
FIG. 2B illustrates a top view of the fins and the substrate.

FIG. 2A illustrates a cut-away view along the line A-A (of FIG. 2B) following the patterning of fins 202. The fins 202 are formed by, for example, a photolithographic patterning and etching process such as reactive ion etching that removes exposed portions of the substrate 102 to form the fins 202. Following the formation of the fins 202, the hardmask 104 can be removed. FIG. 2B illustrates a top view of the fins 202 and the substrate 102.

Figure 3A:
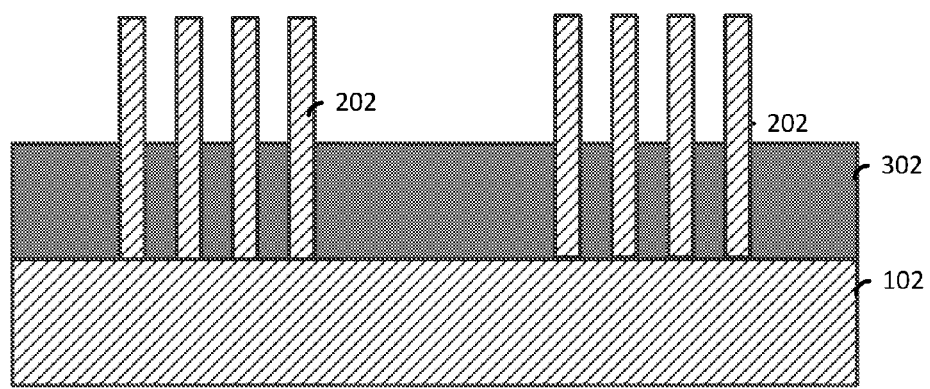
FIG. 3A illustrates a cut-away view along the line A-A (of FIG. 3B) following the deposition of a trench isolation (STI) region over exposed regions of the substrate adjacent to the fins.

FIG. 3A illustrates a cut-away view along the line A-A (of FIG. 3B) following the deposition of a trench isolation (STI) region 302 over exposed regions of the substrate 102 adjacent to the fins 202. The STI region 302 can be formed by, any suitable process including, for example, lithography or etching to form trenches, and then filling the trenches with an insulating material, such as silicon dioxide. Following the deposition of the STI material, an etching process can be performed to remove portions of the STI material and expose the fins 202.

In the illustrated embodiment, at least one isolation region is a shallow trench isolation region ("STI"). However, the isolation region 302 can be a trench isolation region, a field oxide isolation region (not shown), or any other type of isolation region. The isolation region 302 provides isolation between neighboring gate structure regions, and can be used when the neighboring gates have opposite conductivities, e.g., nFETs and pFETs. As such, the isolation region 302 separates an nFET device region from a pFET device region.

Figure 3B:
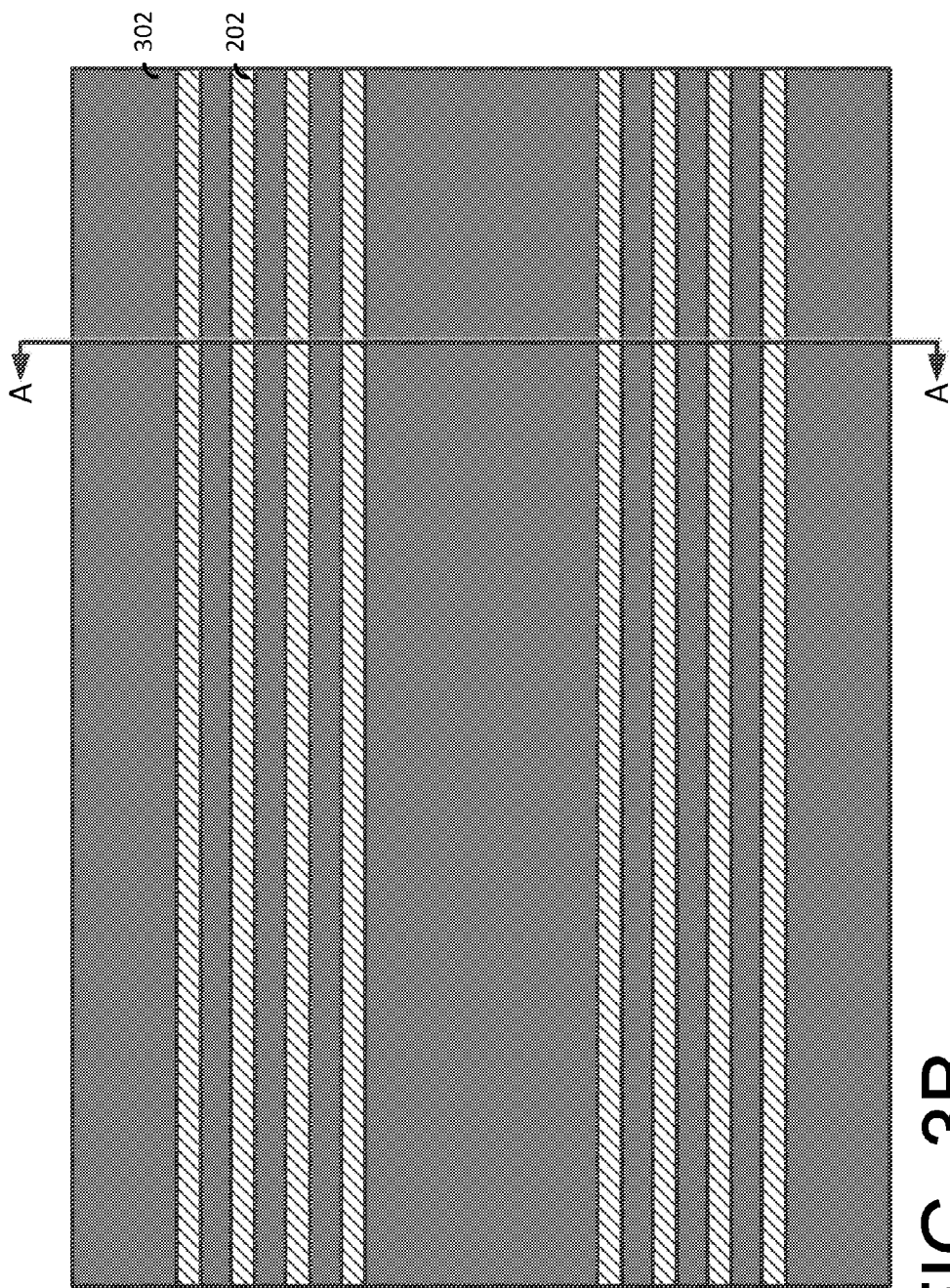
FIG. 3B illustrates a top view following the formation of the trench isolation region.

FIG. 3B illustrates a top view following the formation of the trench isolation region 302.

Figure 4A:
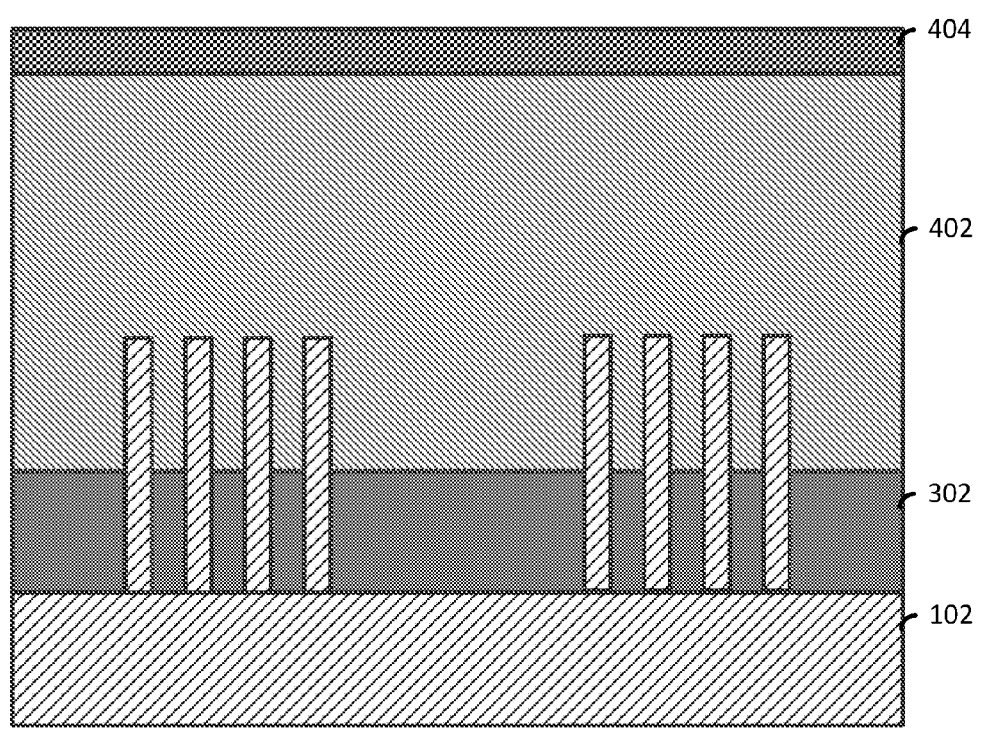
FIG. 4A illustrates a cut-away view along the line A-A (of FIG. 4B) following the patterning of sacrificial gates over channel regions of the fins.

FIG. 4A illustrates a cut-away view along the line A-A (of FIG. 4B) following the patterning of sacrificial gates 402 over channel regions of the fins 202. The sacrificial gates 402 in the exemplary embodiment are formed by depositing a layer (not shown) of sacrificial gate material such as, for example, amorphous silicon (aSi), or polycrystalline silicon (polysilicon) material or another suitable sacrificial gate material. The sacrificial gate 402 can further include a sacrificial gate dielectric material such as silicon oxide between the fins or nanowires and aSi or polysilicon material.

The layer sacrificial gate material can be deposited by a deposition process, including, but not limited to, physical vapor deposition (PVD), chemical vapor deposition (CVD), atomic layer deposition (ALD), plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 404. The hardmask layer can be deposited using a deposition process, including, but not limited to, PVD, CVD, PECVD, or any combination thereof.

Following the deposition of the sacrificial gate material layer and the hardmask layer, a lithographic patterning and etching process such as, for example, reactive ion etching or a wet etching process is performed to remove exposed portions of the hardmask layer and the layer of sacrificial gate material form the sacrificial gates 402 and the sacrificial gate caps 404.

Figure 4B:
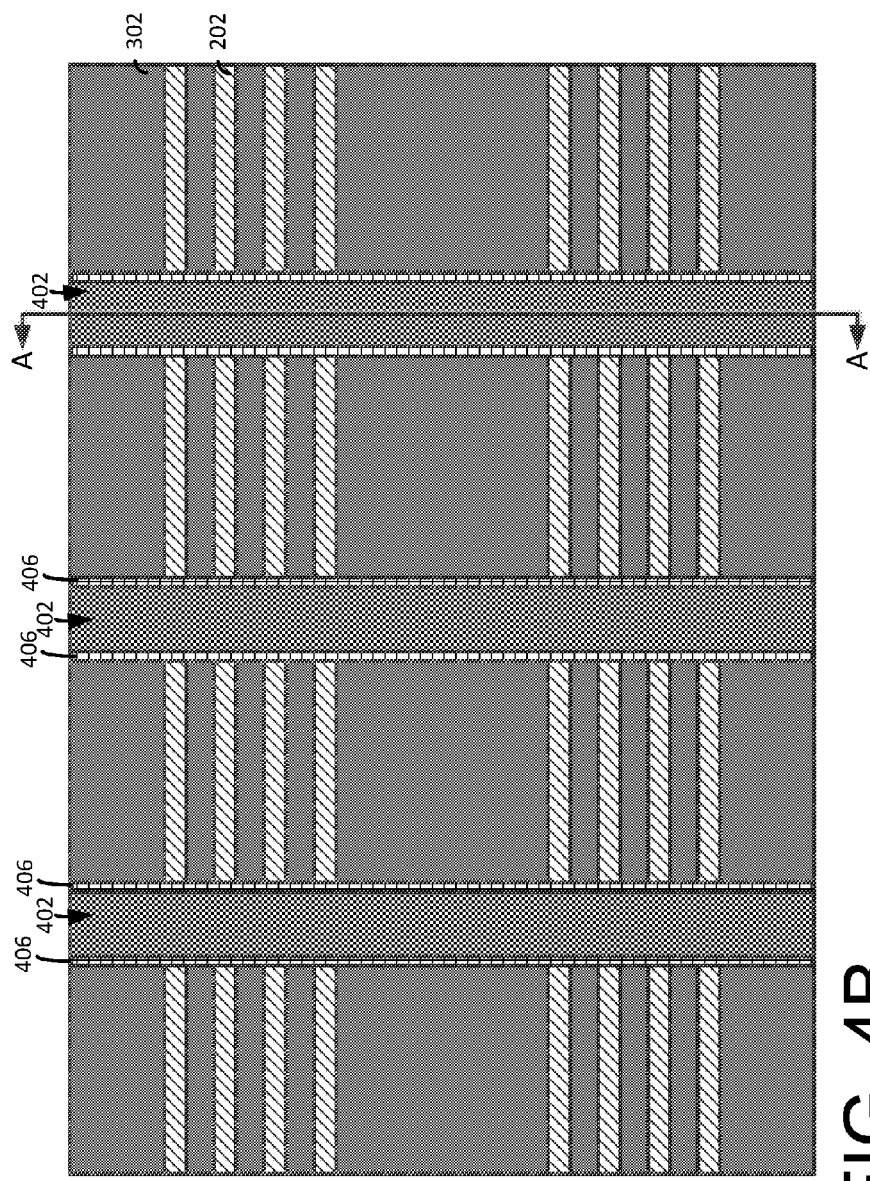
FIG. 4B illustrates a top view following the formation of the sacrificial gates and the formation of spacers adjacent to the sacrificial gates.

FIG. 4B illustrates a top view following the formation of the sacrificial gates 402 and the formation of spacers 406 adjacent to the sacrificial gates 402. The spacers 406 are formed adjacent to the sacrificial gates 402. The spacers 406 in the illustrated embodiment are formed by depositing a layer of spacer material (not shown) over the exposed portions of the fins 202 and the sacrificial gates 402.

Non-limiting examples of suitable materials for the layer of spacer material include dielectric nitrides (e.g., silicon nitride), dielectric oxynitrides, SiBCN, SiOCN, SiOC, dielectric oxides (e.g., silicon oxide), or any combination thereof. The layer of spacer material is deposited by a suitable deposition process, for example, chemical vapor deposition (CVD) or atomic layer deposition (ALD).

Following the deposition of the layer of spacer material, a suitable anisotropic etching process such as, for example, a reactive ion etching process is performed to remove portions of the layer of spacer material on fins and form the spacers 406.

Figure 5A:
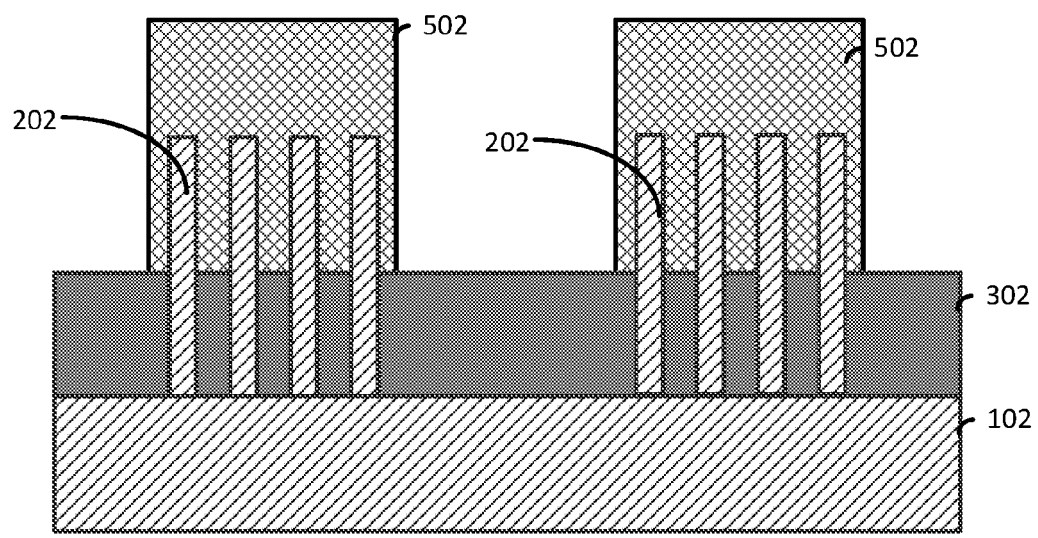
FIG. 5A illustrates a cut-away view along the line B-B (of FIG. 5B) flowing the formation of source/drain regions.
Figure 5B:
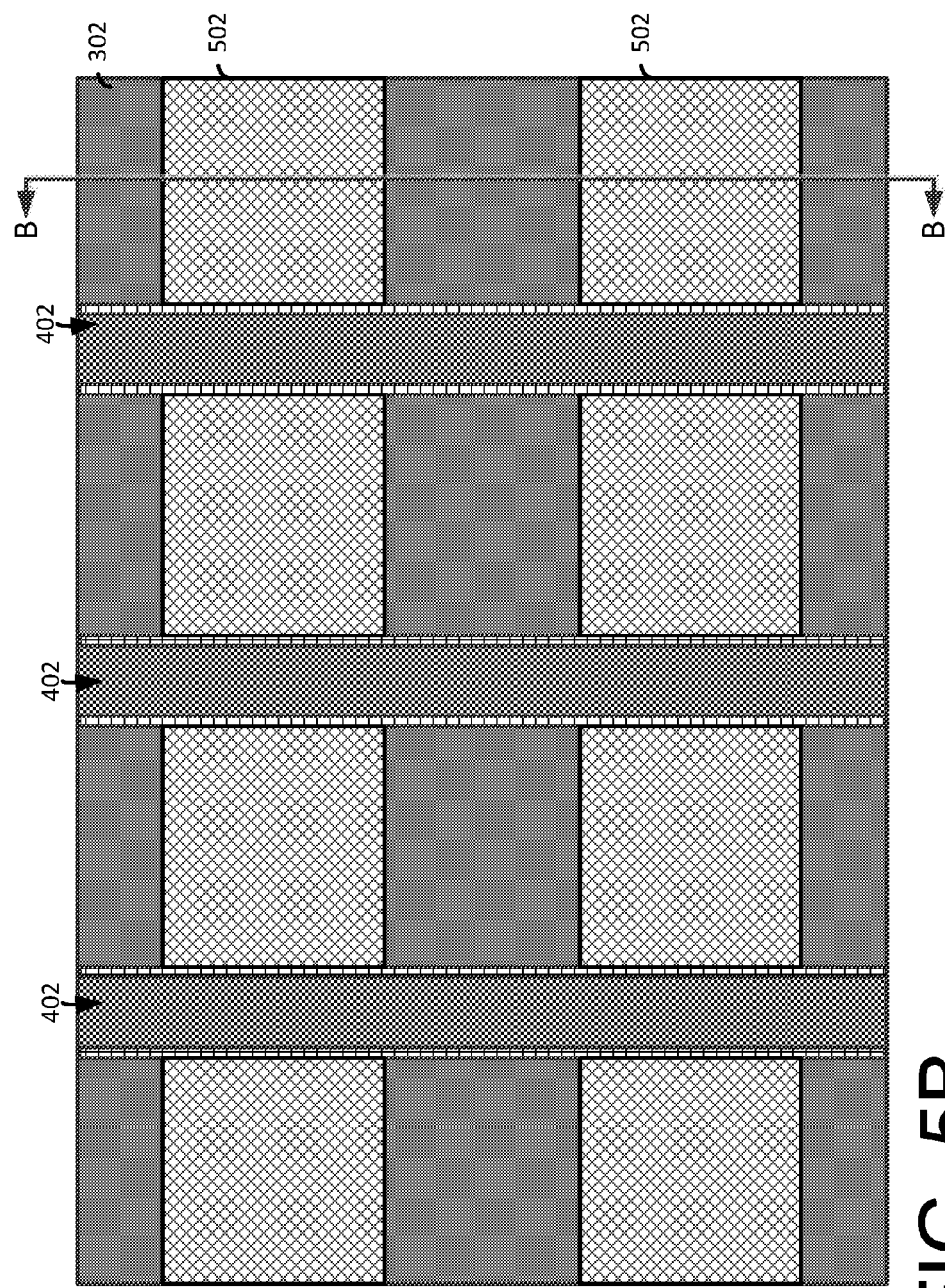
FIG. 5B illustrates a top view following the formation of the source/drain regions.

FIG. 5A illustrates a cut-away view along the line B-B (of FIG. 5B) following the formation of source/drain regions 502. FIG. 5B illustrates a top view following the formation of the source/drain regions 502.

The source/drain regions 502 are formed by an epitaxial growth process that deposits a crystalline overlayer of semiconductor material onto the exposed crystalline seed material of the exposed fin 202 to form the source/drain regions 502.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm-3 to $2\times10^{21}$ cm-3, or between $2\times10^{20}$ cm-3 and $1\times10^{21}$ cm-3.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 6A:
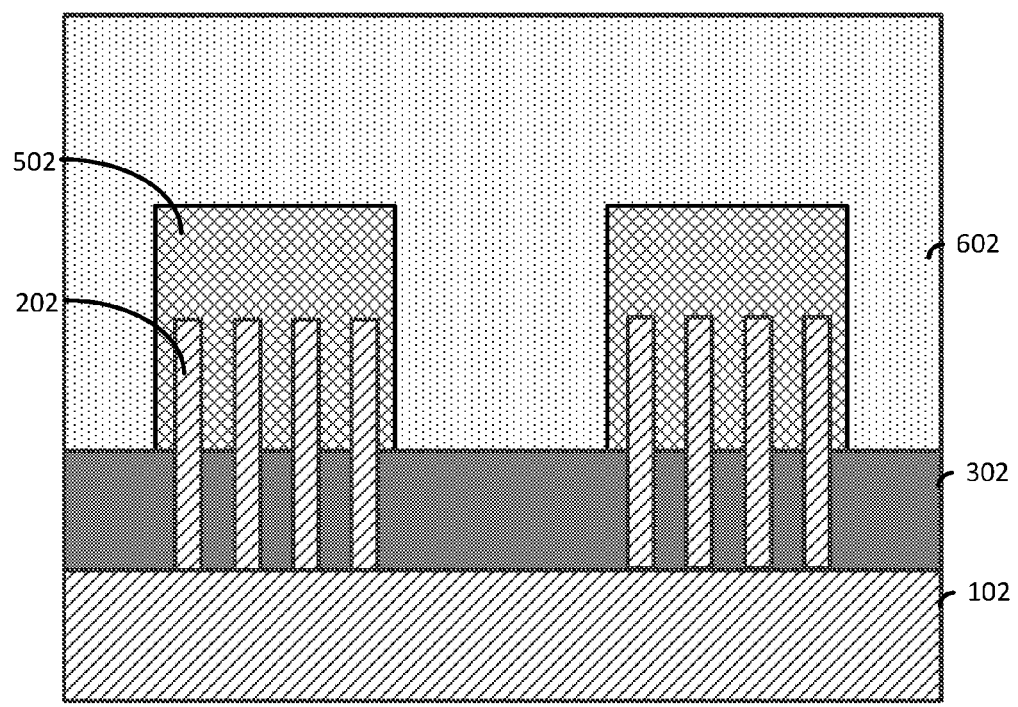
FIG. 6A illustrates a cut-away view along the line B-B (of FIG. 6B) following the deposition of an inter-level dielectric layer over portions of the substrate and the source/drain regions.
Figure 6B:
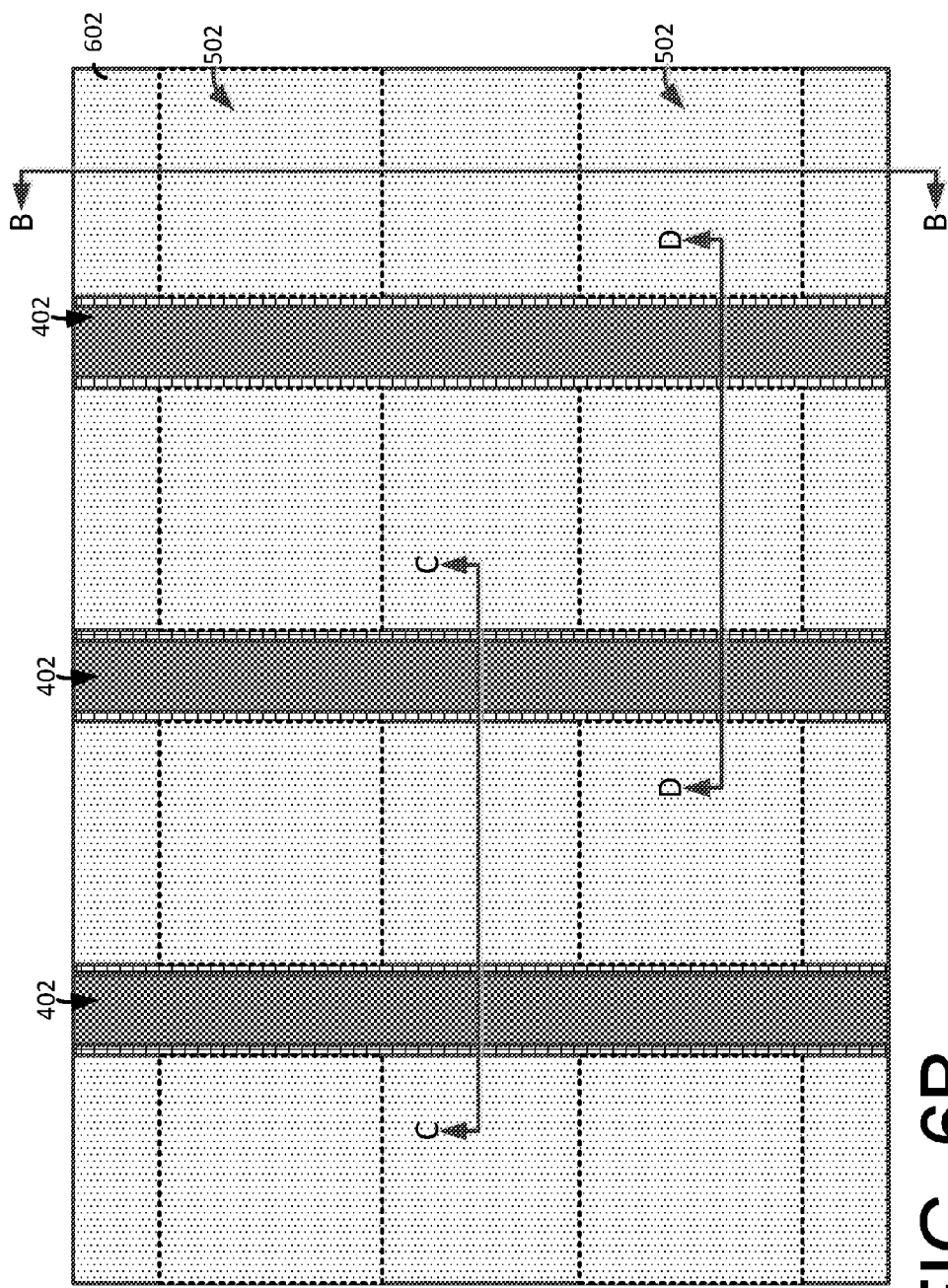
FIG. 6B illustrates a top view flowing the formation of the inter-level dielectric layer.

FIG. 6A illustrates a cut-away view along the line B-B (of FIG. 6B) following the deposition of an inter-level dielectric layer 602 over portions of the substrate 102 and the source/drain regions 502. FIG. 6B illustrates a top view flowing the formation of the inter-level dielectric layer 602. An interface layer (not shown), such as, for example, a nitride liner layer can be deposited prior to the deposition of the inter-level dielectric layer 602 on the source/drain regions 502. The interface layer can mitigate or prevent oxidation in the source/drain region 502 due to the inter-level dielectric layer 602 and can serve as an etch stop layer during the formation of the contacts described below.

Figure 7A:
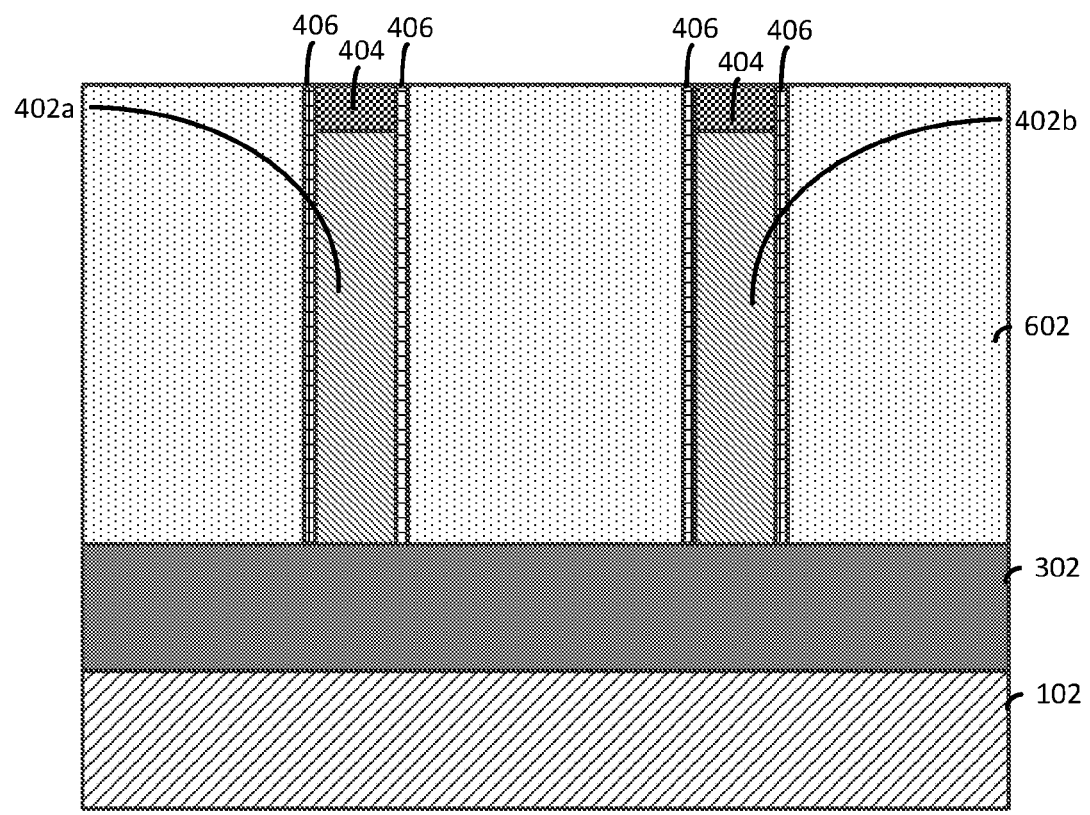
FIG. 7A illustrates a cut-away view along the line C-C (of FIG. 6B) of the sacrificial gates following the deposition of the inter-level dielectric layer.
Figure 7B:
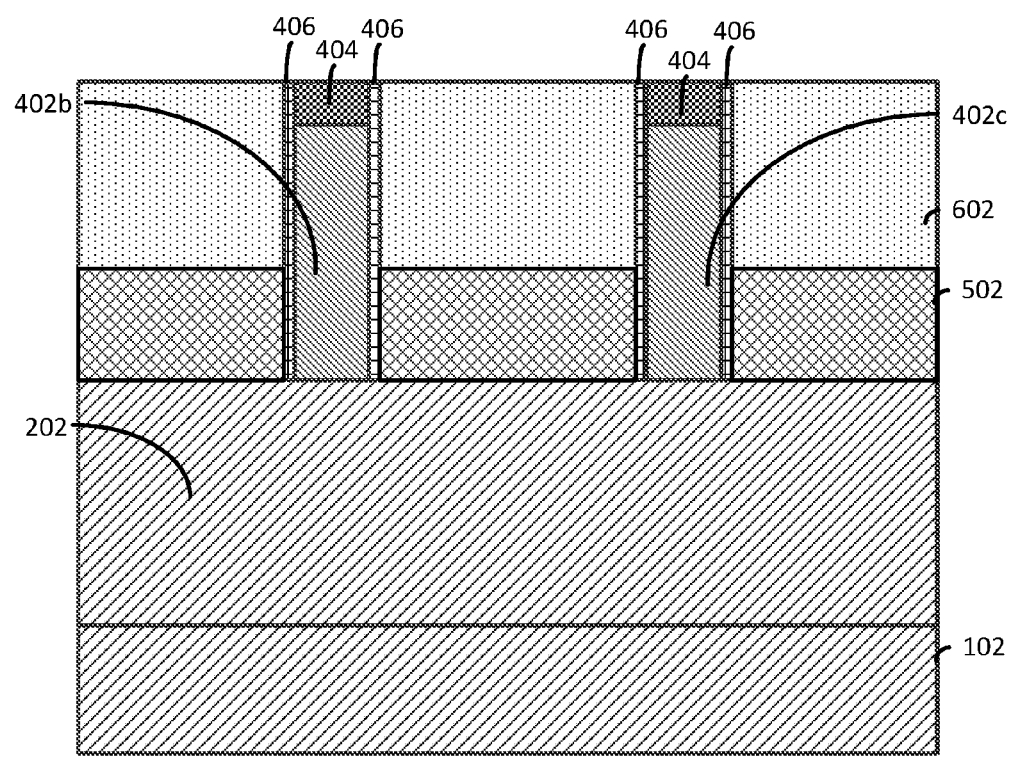
FIG. 7B illustrates a cut-away view along the line D-D (of FIG. 6B) of the sacrificial gates following the deposition of the inter-level dielectric layer.

FIG. 7A illustrates a cut-away view along the line C-C (of FIG. 6B) of the sacrificial gates 402a and 402b following the deposition of the inter-level dielectric layer 602. FIG. 7B illustrates a cut-away view along the line D-D (of FIG. 6B) of the sacrificial gates 402b and 402c following the deposition of the inter-level dielectric layer 602.

Figure 8A:
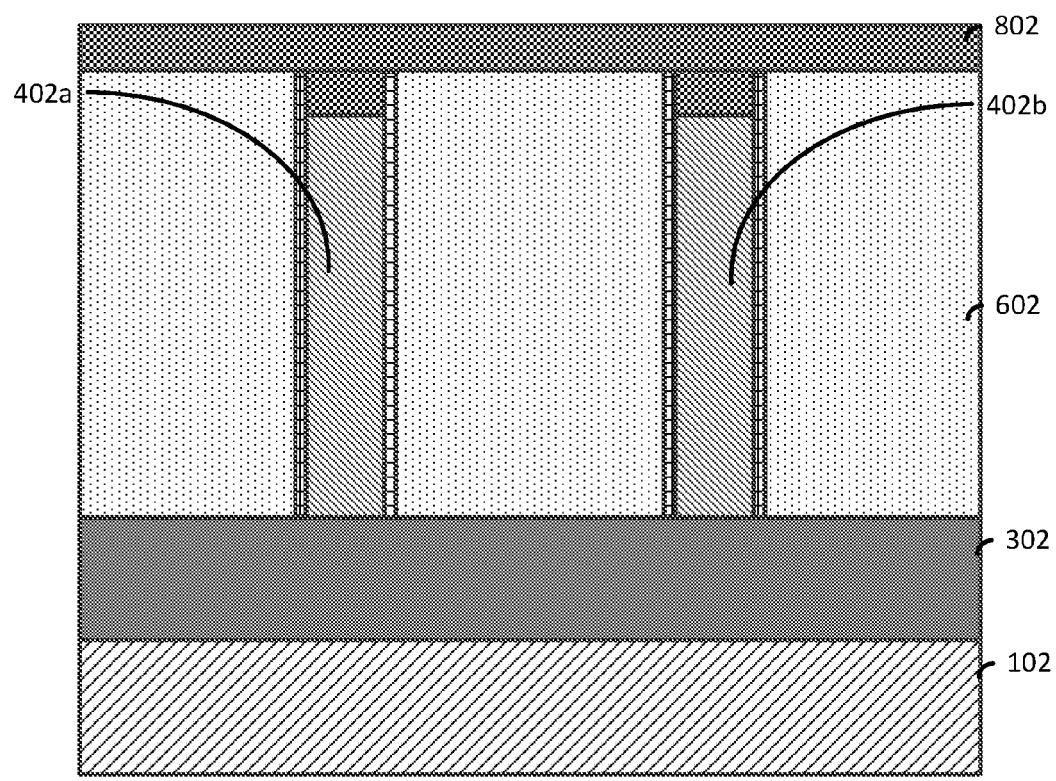
FIG. 8A illustrates a cut-away view of the sacrificial gates and following the deposition of a sacrificial liner layer over the sacrificial gates.
Figure 8B:
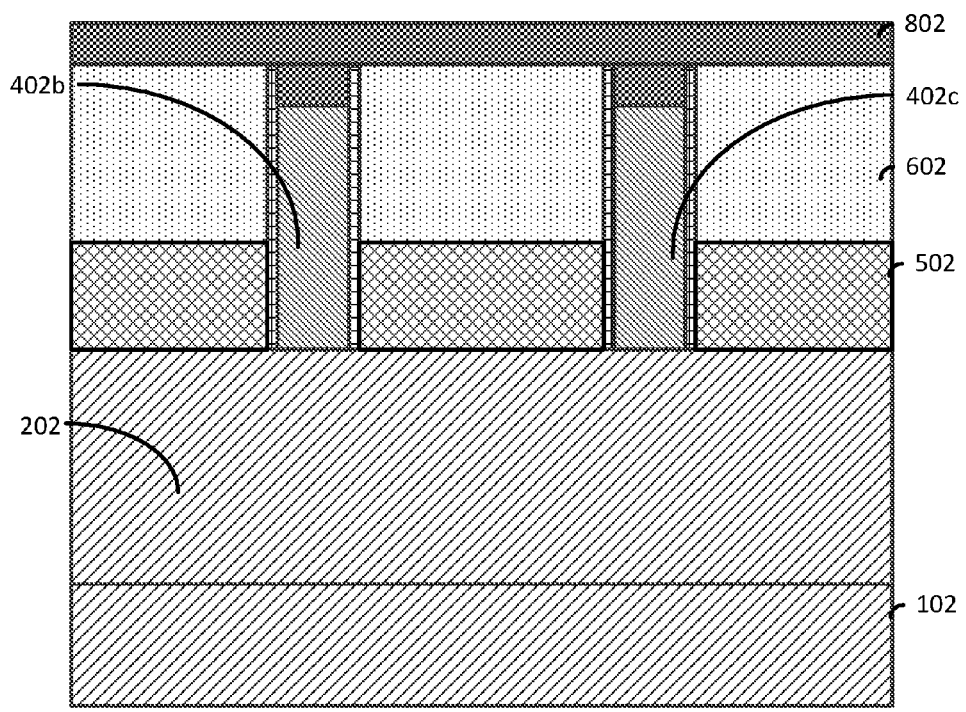
FIG. 8B illustrates a cut-away view of the sacrificial gates following the deposition of a sacrificial liner layer over the sacrificial gates.

FIG. 8A illustrates a cut-away view of the sacrificial gates 402a and 402b following the deposition of a sacrificial liner layer 802 over the sacrificial gates 402a and 402b. FIG. 8B illustrates a cut-away view of the sacrificial gates 402b and 402c following the deposition of a sacrificial liner layer 802 over the sacrificial gates 402b and 402c. The sacrificial liner layer 802 can include for example a nitride material.

Figure 9A:
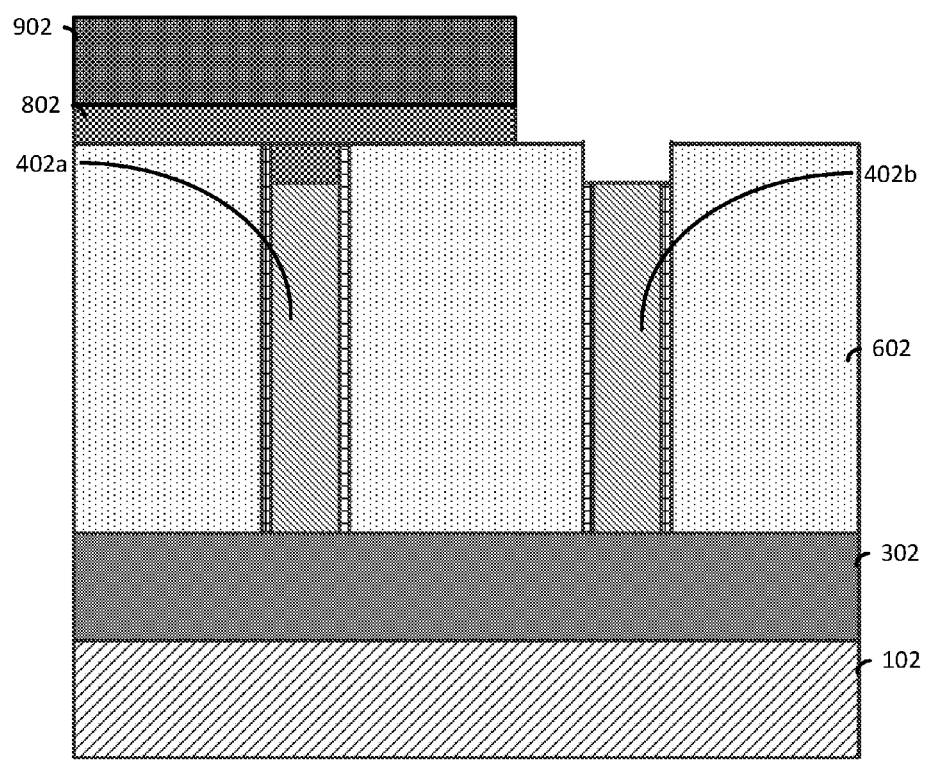
FIG. 9A illustrates a cut-away view along the line C-C (of FIG. 9C) following the patterning of a mask over portions of the sacrificial liner layer to remove exposed portions of the sacrificial liner layer and exposed portions of the gate caps and the spacers to expose portions of the sacrificial gates.

FIG. 9A illustrates a cut-away view along the line C-C (of FIG. 9C) following the patterning of a mask 902 over portions of the sacrificial liner layer 802 to remove exposed portions of the sacrificial liner layer 802 and exposed portions of the gate caps 404 and the spacers 406 to expose portions of the sacrificial gates 402. Suitable masks include photoresists, electron-beam resists, ion-beam resists, X-ray resists, etch resists, and optical planarization layers. The resist can a polymeric spin on material or a polymeric material.

Figure 9B:
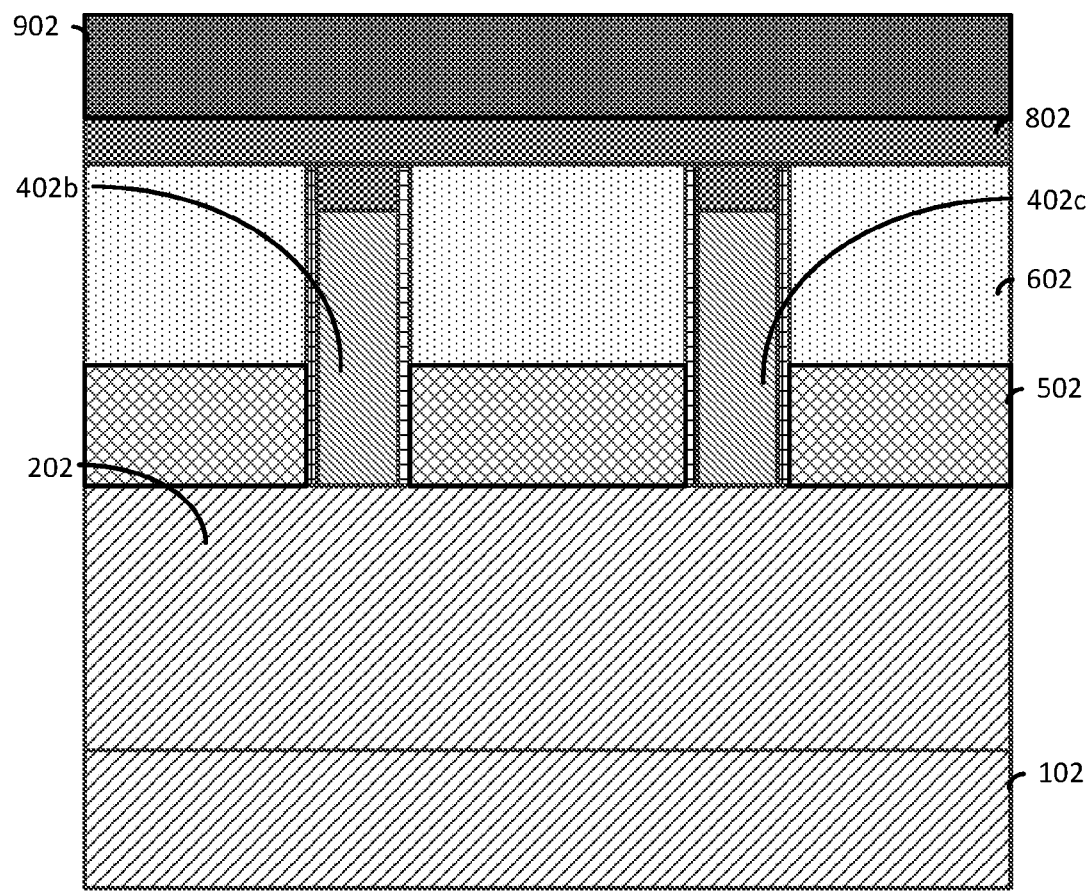
FIG. 9B illustrates a cut-away view along the line D-D (of FIG. 9C) following the patterning of the mask.
Figure 9C:
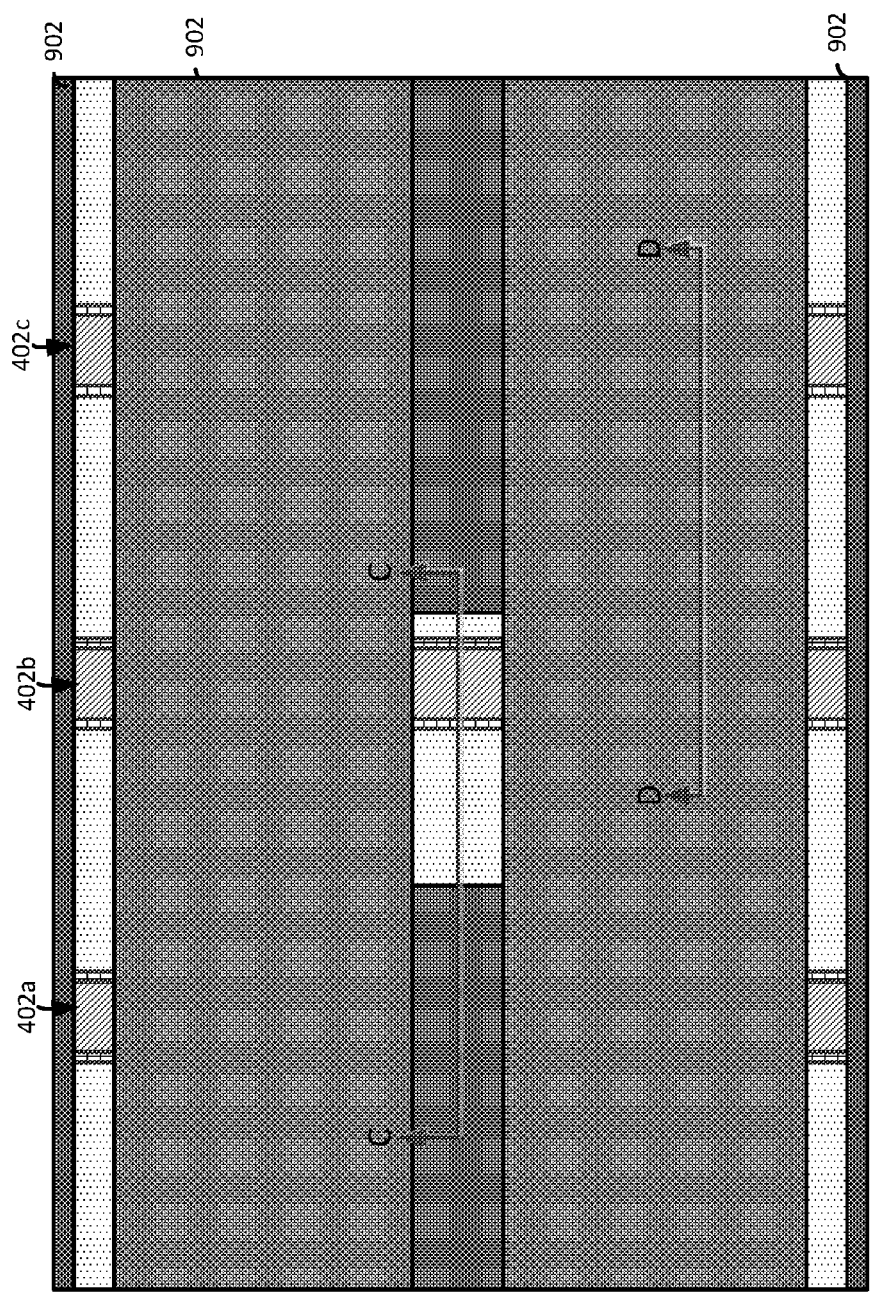
FIG. 9C illustrates a top view of the mask.

FIG. 9B illustrates a cut-away view along the line D-D (of FIG. 9C) following the patterning of the mask 902. FIG. 9C illustrates a top view of the mask 902.

Figure 10:
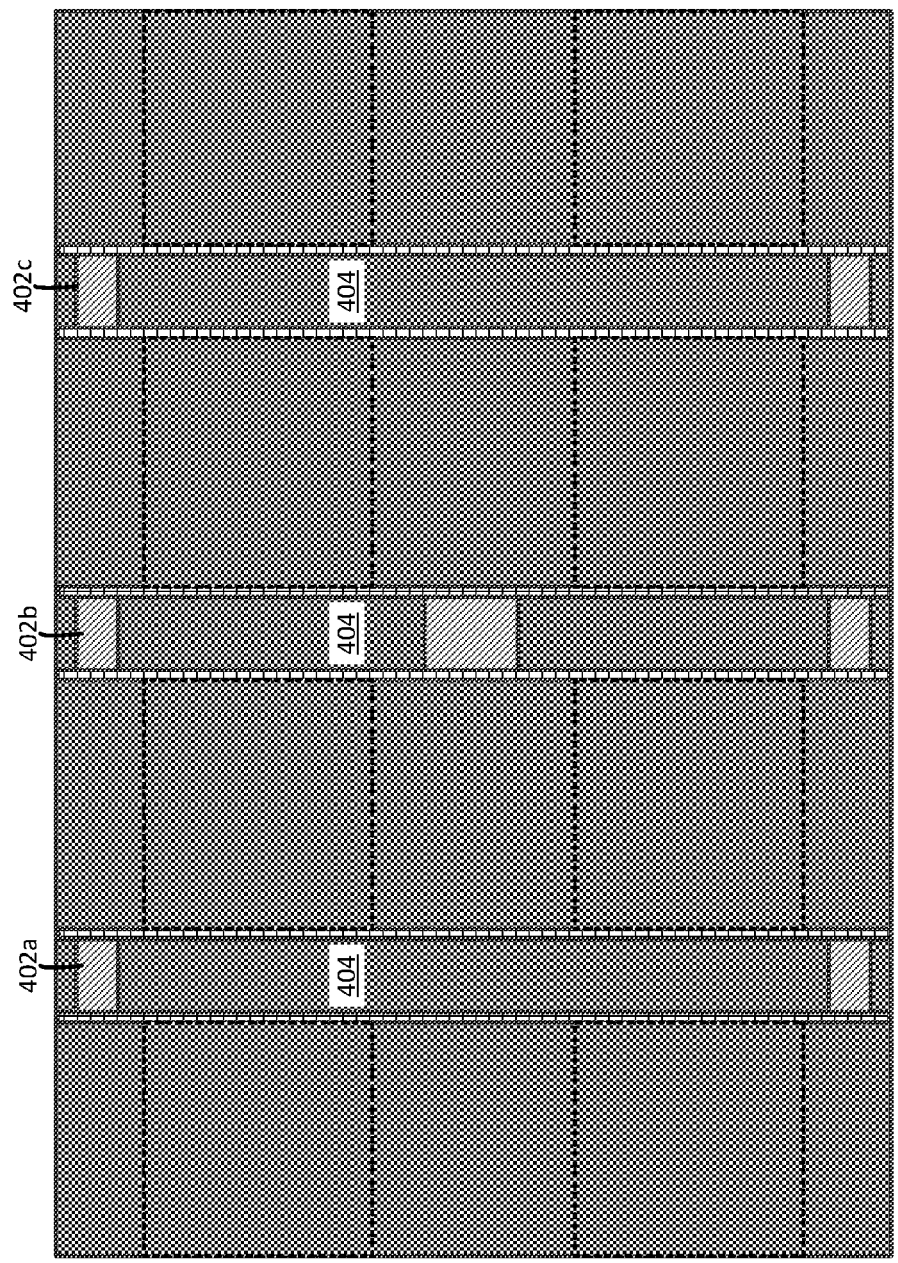

FIG. 10 illustrates a top view following the removal of the mask 902 by, for example, an ashing process. The ashing process can be used to remove a photoresist material, amorphous carbon, or organic planarization (OPL) layer. Ashing is performed using a plasma etch with a suitable reaction gas, for example, O2, N2, H2/N2, O3, CF4, or any combination thereof.

Figure 11A:
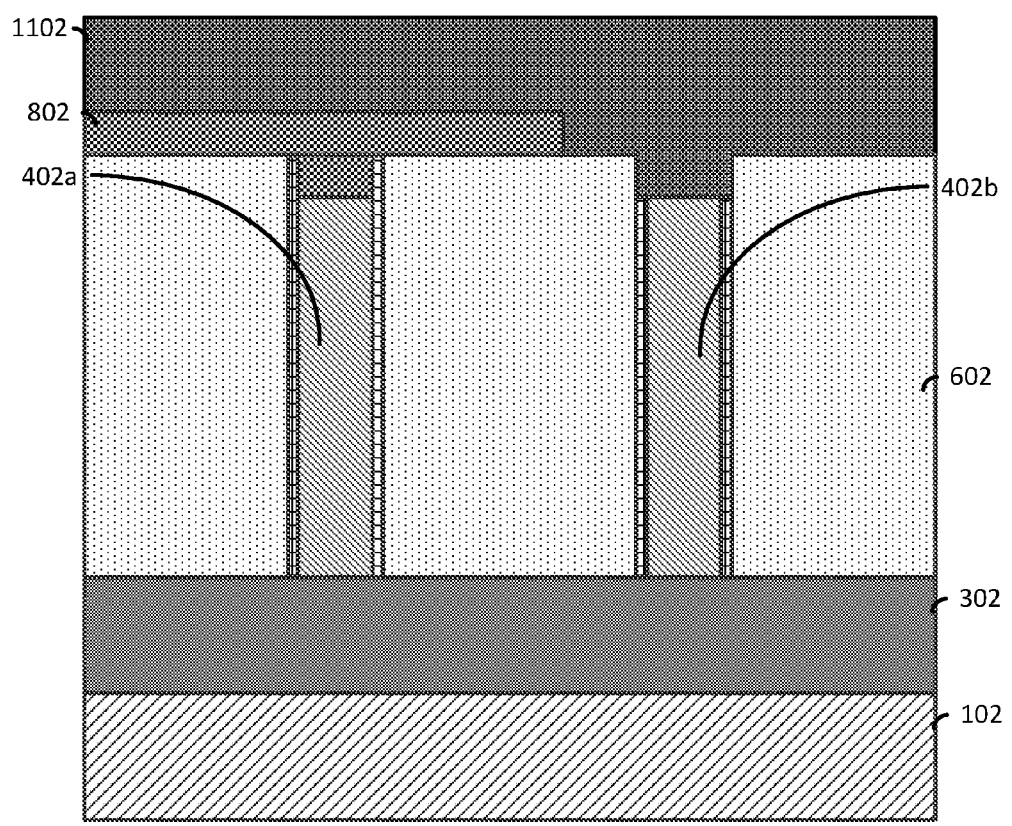
FIG. 11A illustrates a cut-away view along the line C-C (of FIG. 11C) following the patterning of a second mask over portions of the sacrificial liner layer and the sacrificial gates and an etching process that removes exposed portions of the sacrificial liner layer and exposed portions of the gate caps and the spacers to expose portions of the sacrificial gate.
Figure 11B:
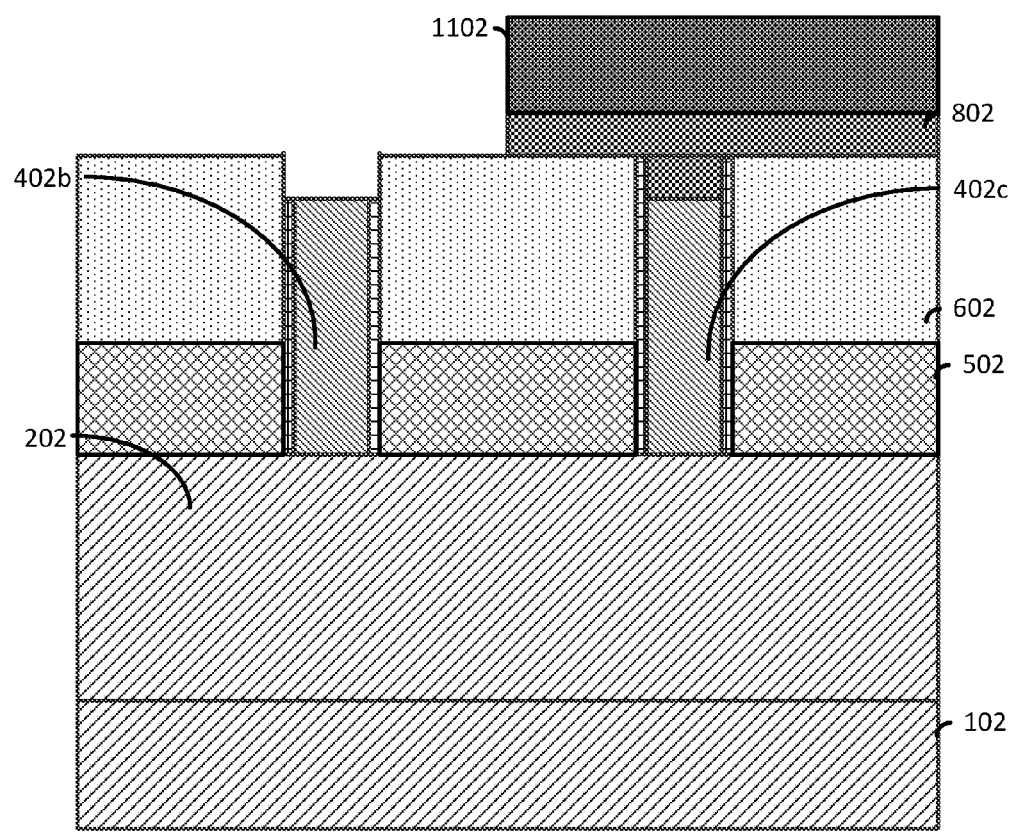
FIG. 11B illustrates a cut-away view along the line D-D (of FIG. 11C) following patterning the second mask and removing exposed portions of the sacrificial liner layer and exposed portions of the gate caps and the spacers to expose portions of the sacrificial gate.
Figure 11C:
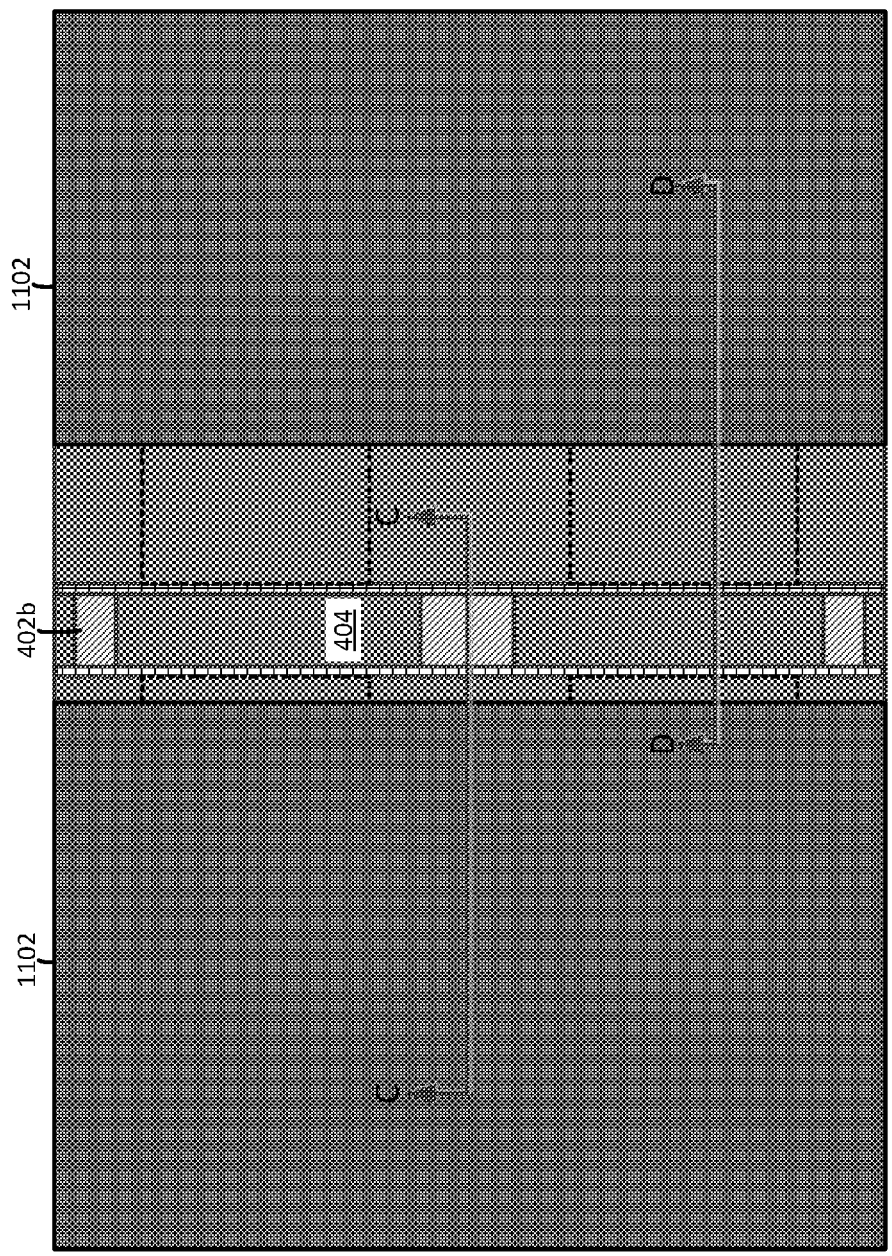
FIG. 11C illustrates a top view of the second mask.

FIG. 11A illustrates a cut-away view along the line C-C (of FIG. 11C) following the patterning of a second mask 1102 over portions of the sacrificial liner layer 802 and the sacrificial gates 402 and an etching process that removes exposed portions of the sacrificial liner layer 802 and exposed portions of the gate caps 404 and the spacers 406 to expose portions of the sacrificial gate 402b. FIG. 11B illustrates a cut-away view along the line D-D (of FIG. 11C) following patterning the second mask 1102 and removing exposed portions of the sacrificial liner layer 802 and exposed portions of the gate caps 404 and the spacers 406 to expose portions of the sacrificial gate 402b. FIG. 11C illustrates a top view of the second mask 1102.

Figure 12A:
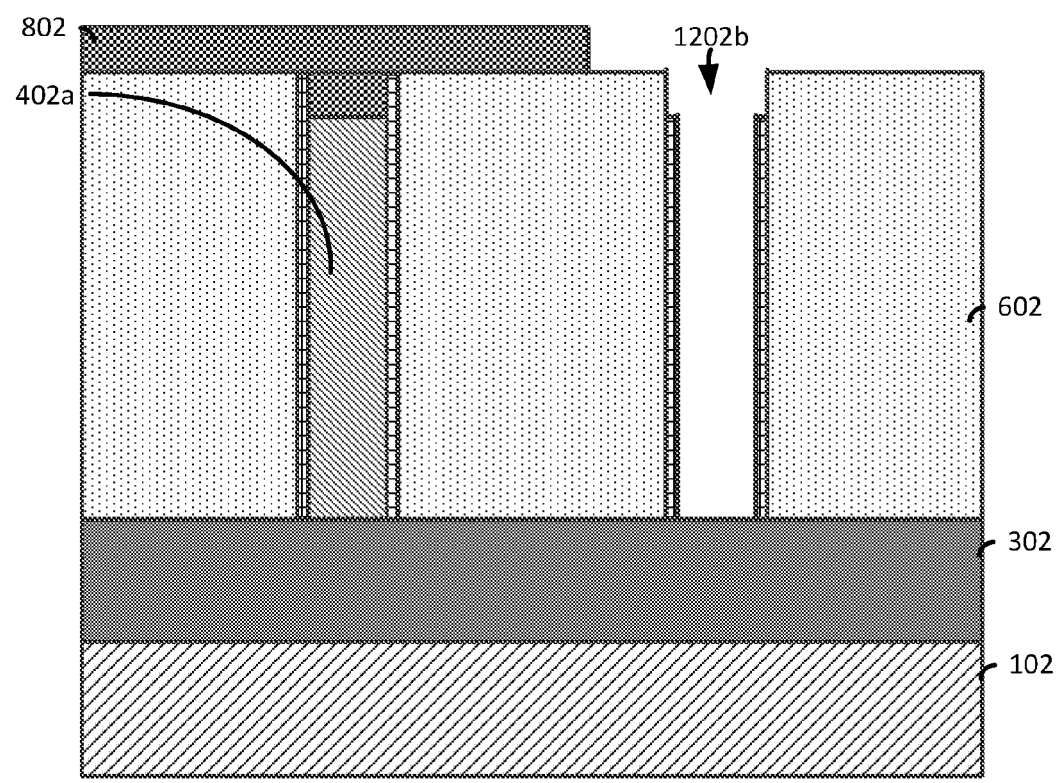
FIG. 12A illustrates a cut-away view along the line C-C (of FIG. 11C) following the removal of exposed portions of the sacrificial gate (of FIG. 11A), which forms cavities that expose portions of the trench isolation region and the fins.
Figure 12B:
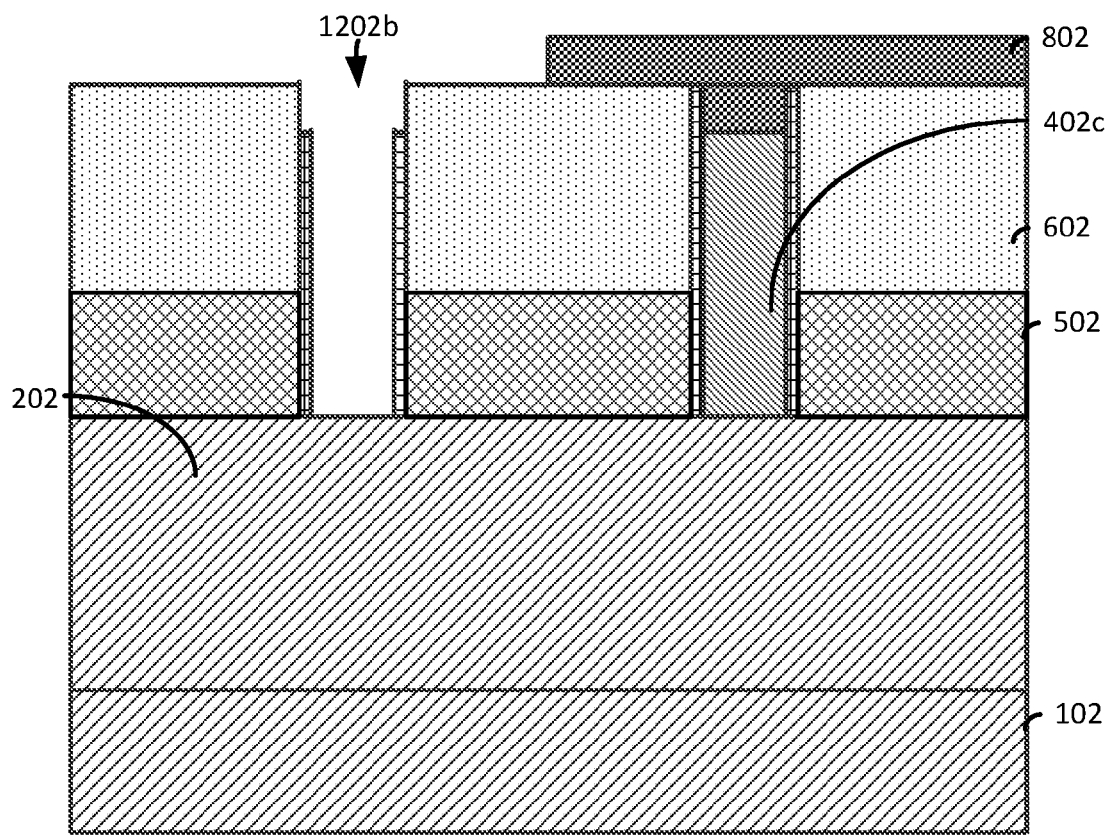
FIG. 12B illustrates a cut-away view along the line D-D (of FIG. 11C) following the removal of portions of the sacrificial gate.

FIG. 12A illustrates a cut-away view along the line C-C (of FIG. 11C) following the removal of exposed portions of the sacrificial gate 402b (of FIG. 11A), which forms cavities 1202 that expose portions of the trench isolation region 302 and the fins 202. The portions of the sacrificial gates 402 can be removed by performing an anisotropic dry etch process, for example, RIE, to maintain the required critical dimension of the cut trenches. This anisotropic RIE can be followed by a wet etch process. The wet etch process is selective to (will not substantially etch) the spacers 406 and the inter-level dielectric material 602. The chemical etch process can include, but is not limited to, hot ammonia or tetramethylammonium hydroxide (TMAH). FIG. 12B illustrates a cut-away view along the line D-D (of FIG. 11C) following the removal of portions of the sacrificial gate 402b.

Figure 13A:
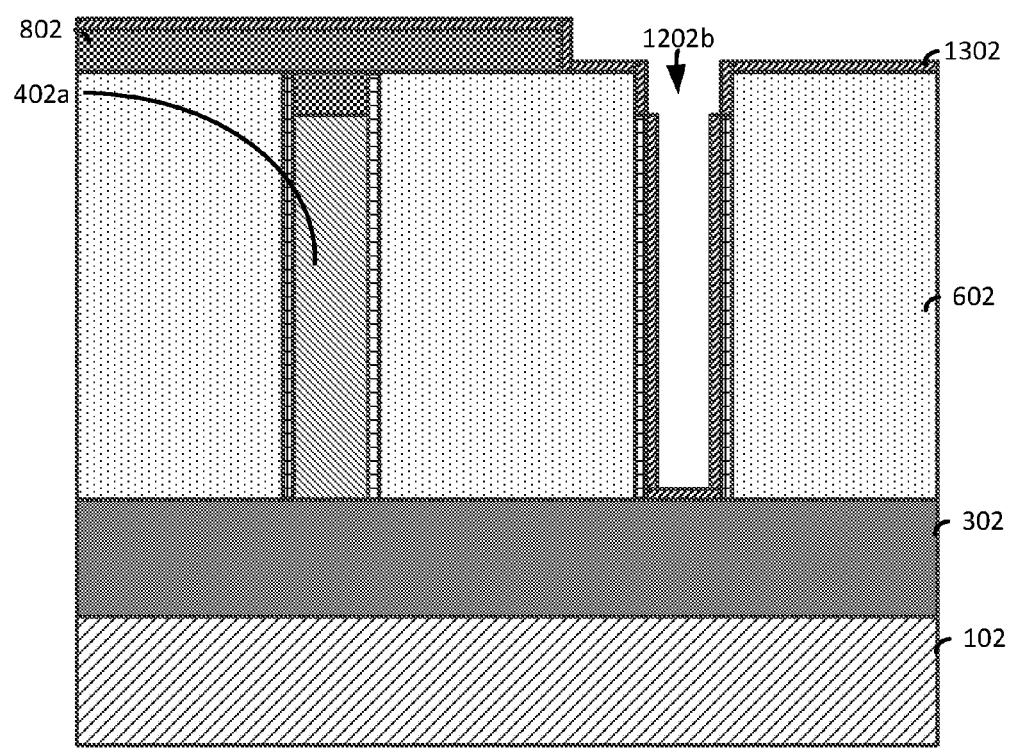
FIG. 13A illustrates a cut-away view following the deposition of a liner layer that is deposited conformally in the cavity.
Figure 13B:
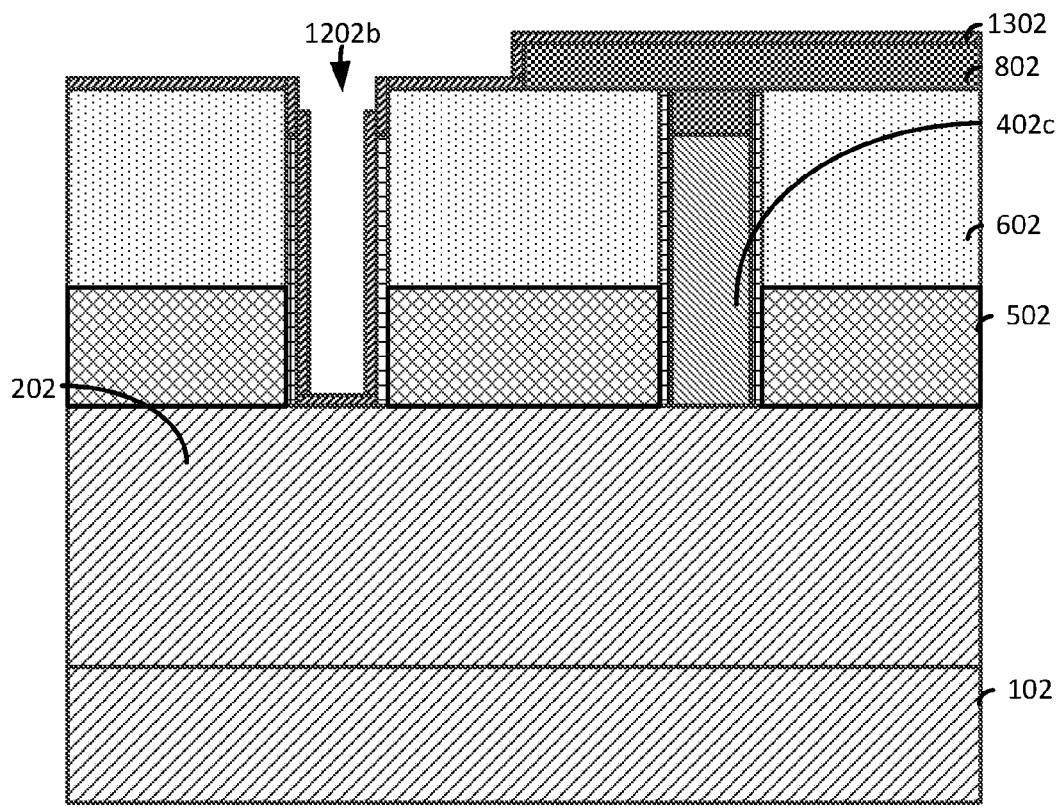
FIG. 13B illustrates a cut-away view following the deposition of the liner layer.

FIG. 13A illustrates a cut-away view following the deposition of a liner layer 1302 that is deposited conformally in the cavity 1202b. The liner layer 1302 can include, for example, SiN, $SiO_2$, $HfO_2$, or other suitable materials. FIG. 13B illustrates a cut-away view following the deposition of the liner layer 1302. The liner layer 1302 prevents pattern critical dimension (CD) blow-up during the second Si etching step (fin etching step). Since the gate cut (CT) stops on STI, additional Si etching will expand the CT CD width to an undesired size. The 1302 layer is used to "mask" this lateral etching of the a-Si during the etching.

Figure 14A:
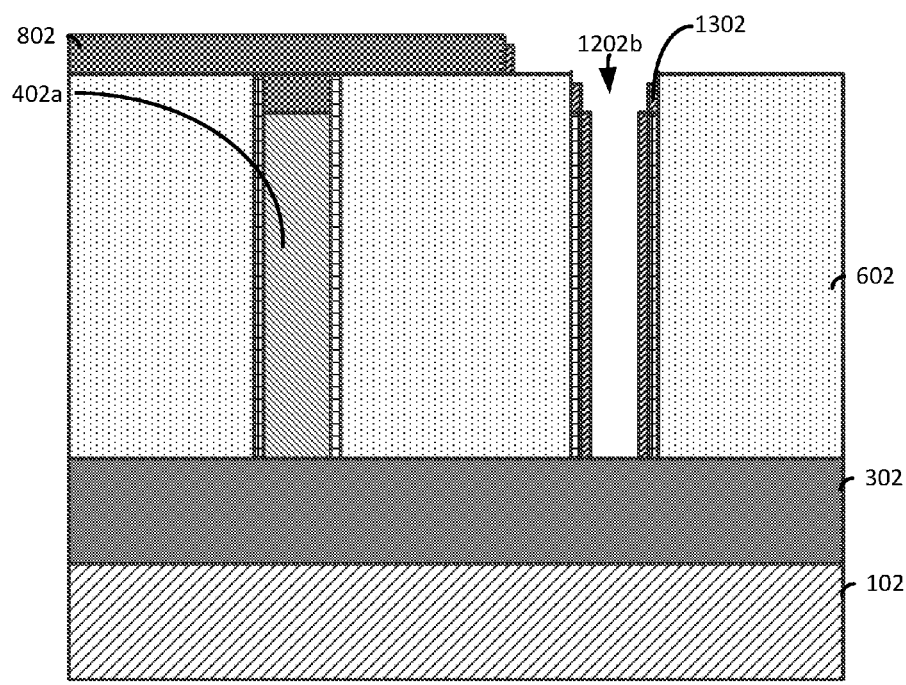
FIG. 14A illustrates a cut-away view following an etching process that removes portions of the liner layer such that portions of the liner layer remain along the sidewalls of the spacers.
Figure 14B:
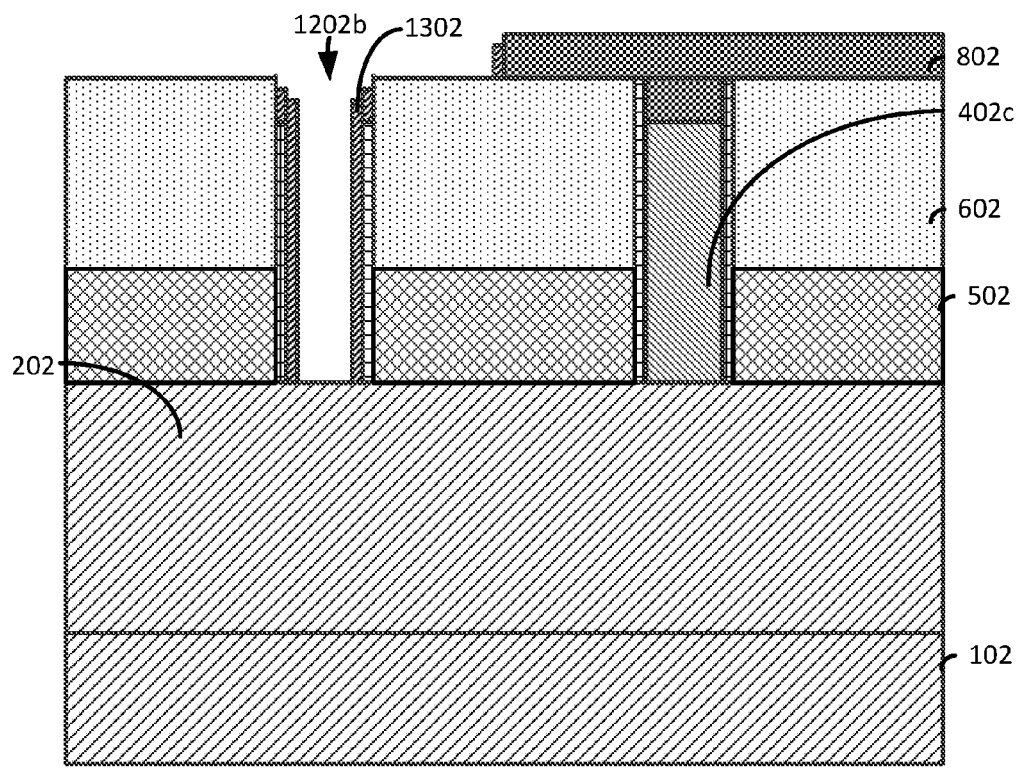
FIG. 14B illustrates a cut-away view following the removal of portions of the liner layer.

FIG. 14A illustrates a cut-away view following an etching process that removes portions of the liner layer 1302 such that portions of the liner layer 1302 remain along the sidewalls of the spacers 406. A directional selective anisotropic etch such as, for example, reactive ion etching can be performed. FIG. 14B illustrates a cut-away view following the removal of portions of the liner layer 1302.

Figure 15A:
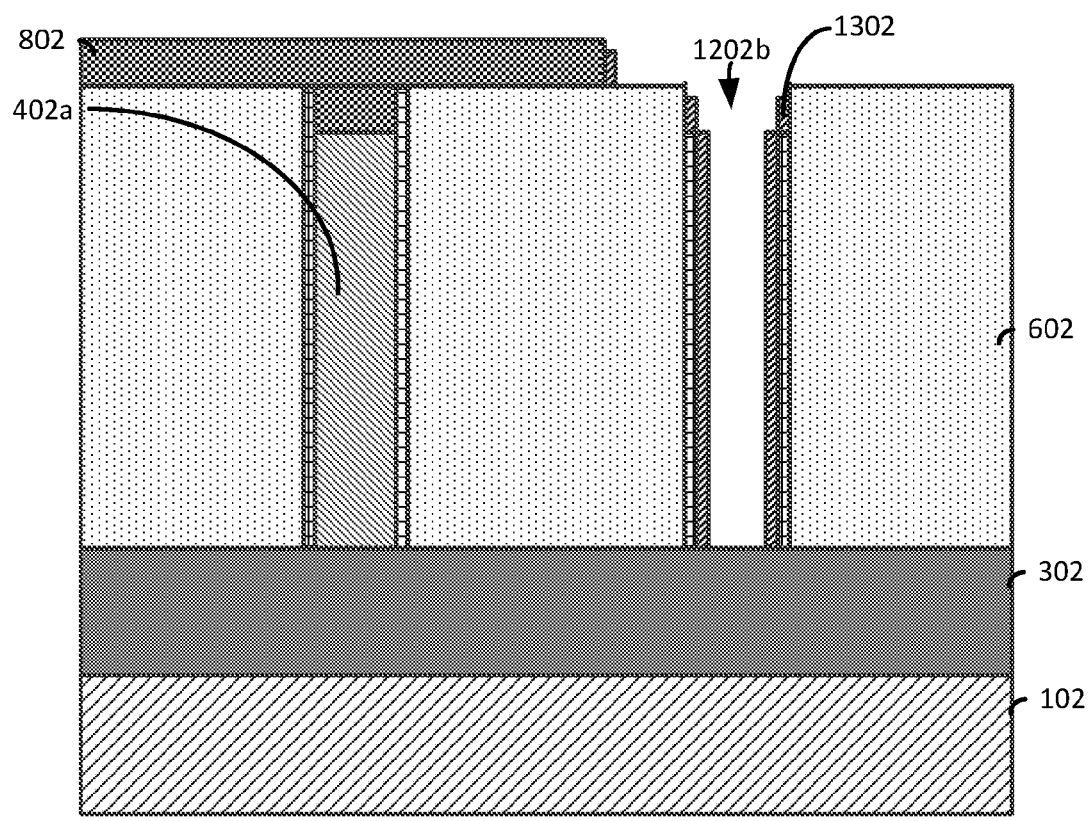
FIGS. 15A and 15B illustrate cut-away views following a selective anisotropic etching process that removes exposed portions of the fins and the substrate to increase the depth of portions of the cavity.
Figure 15B:
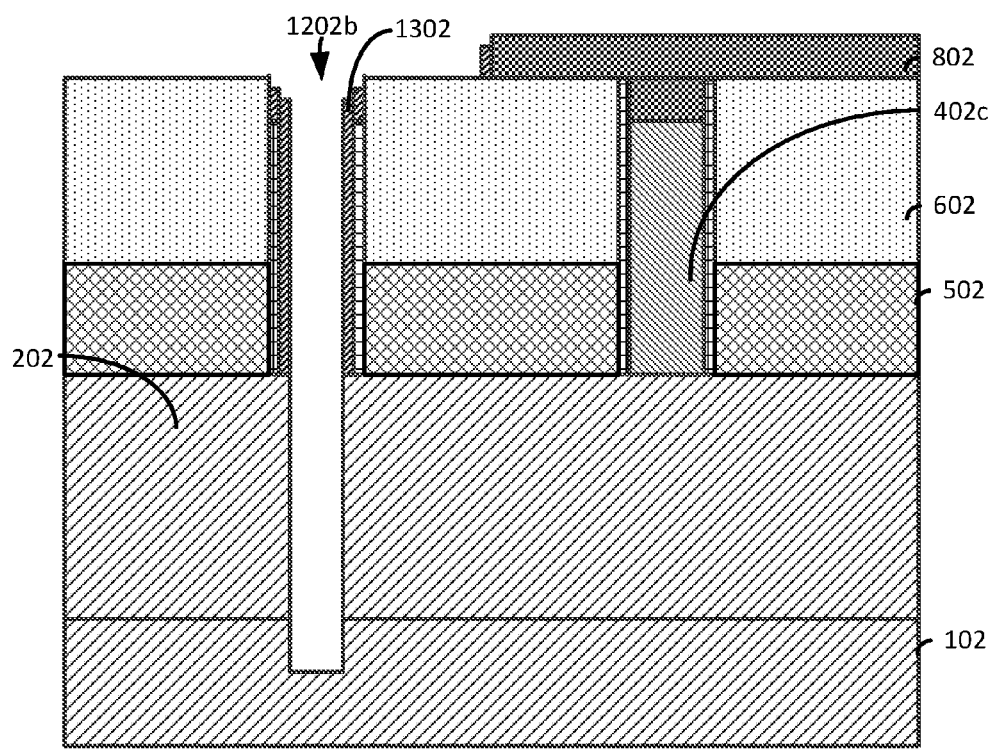

FIGS. 15A and 15B illustrate cut-away views following a selective anisotropic etching process that removes exposed portions of the fins 202 and the substrate 102 to increase the depth of portions of the cavity 1202b. The etching process "cuts" the exposed fins 202 and removes portions of the substrate 102 arranged below the fins 202.

Figure 16A:
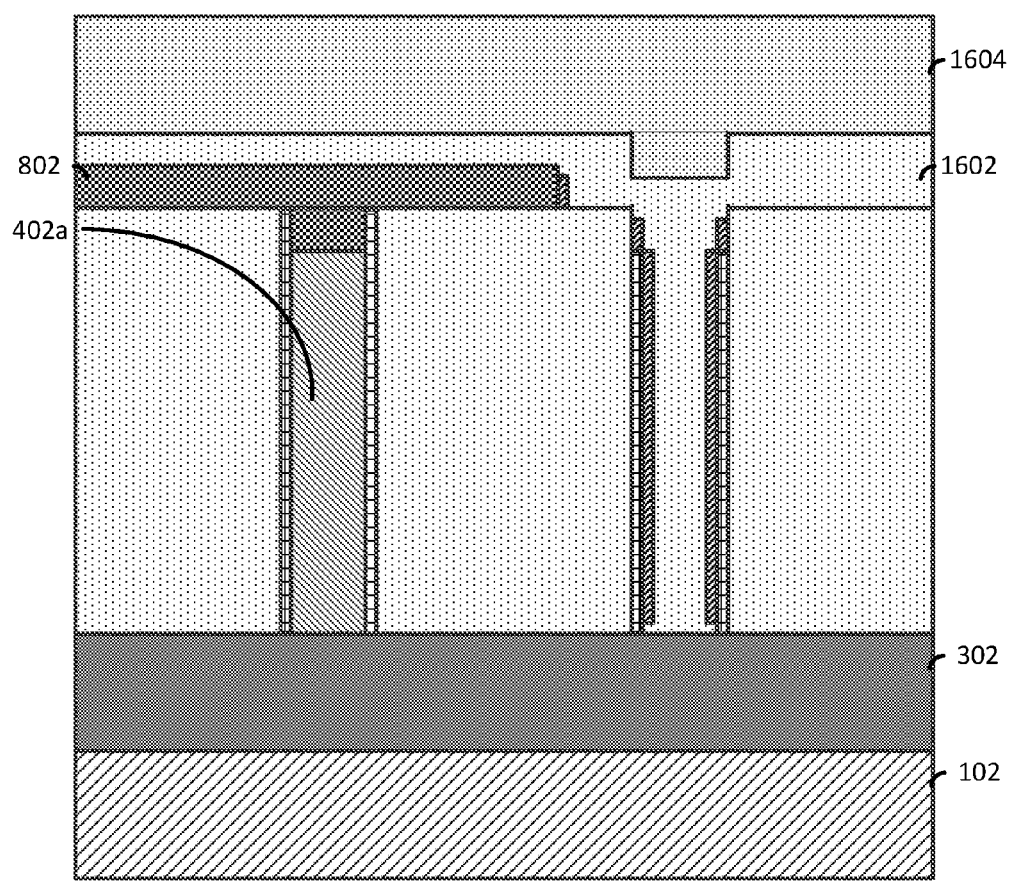
FIG. 16A illustrates a cut-away view following the deposition of a dielectric (insulator) fill layer in the cavities (of FIG. 15A) and a planarization layer over the dielectric fill layer.
Figure 16B:
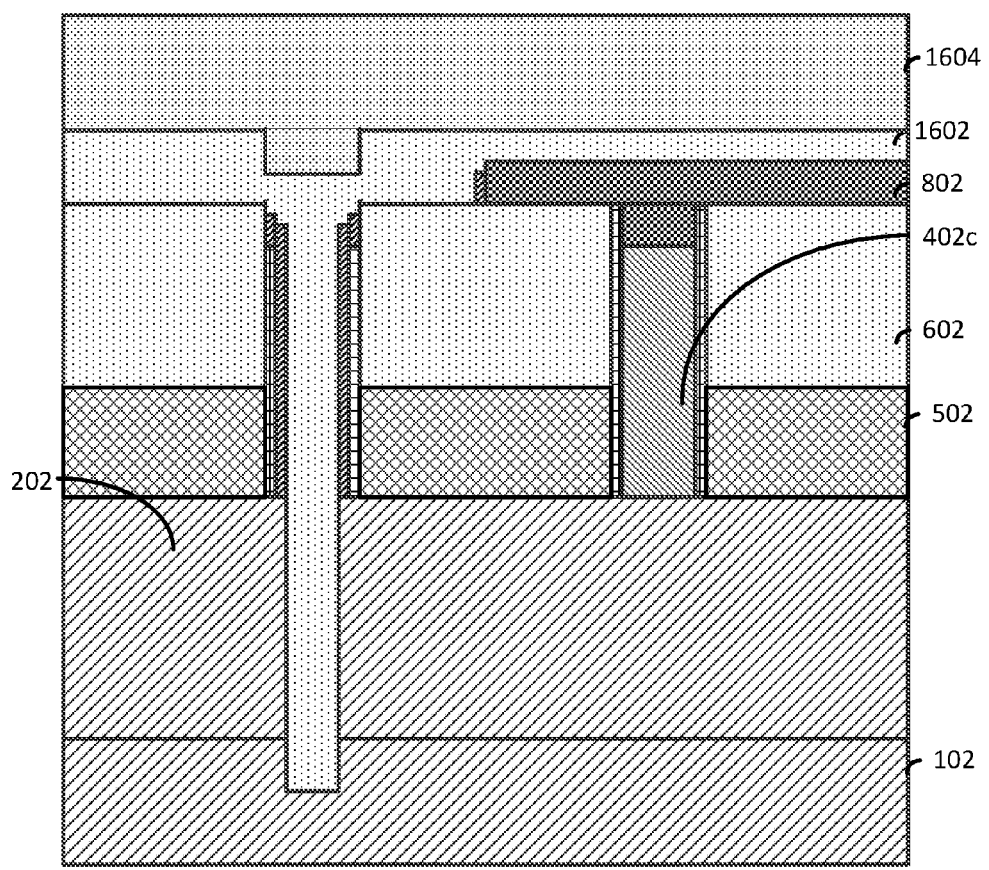
FIG. 16B illustrates a cut-away view of the dielectric fill layer and the planarization layer.

FIG. 16A illustrates a cut-away view following the deposition of a dielectric (insulator) fill layer 1602 in the cavities 1202 (of FIG. 15A) and a planarization layer 1604 over the dielectric fill layer 1602. Prior to the deposition of the dielectric fill layer 1602, a wet cleaning process can be performed to remove residual reactive ion etching byproducts. The dielectric fill layer 1602 can be deposited by, for example, an atomic layer deposition process. The planarization layer 1602 can include a silane oxide or other type of planarization material. FIG. 16B illustrates a cut-away view of the dielectric fill layer 1602 and the planarization layer 1604.

Figure 17A:
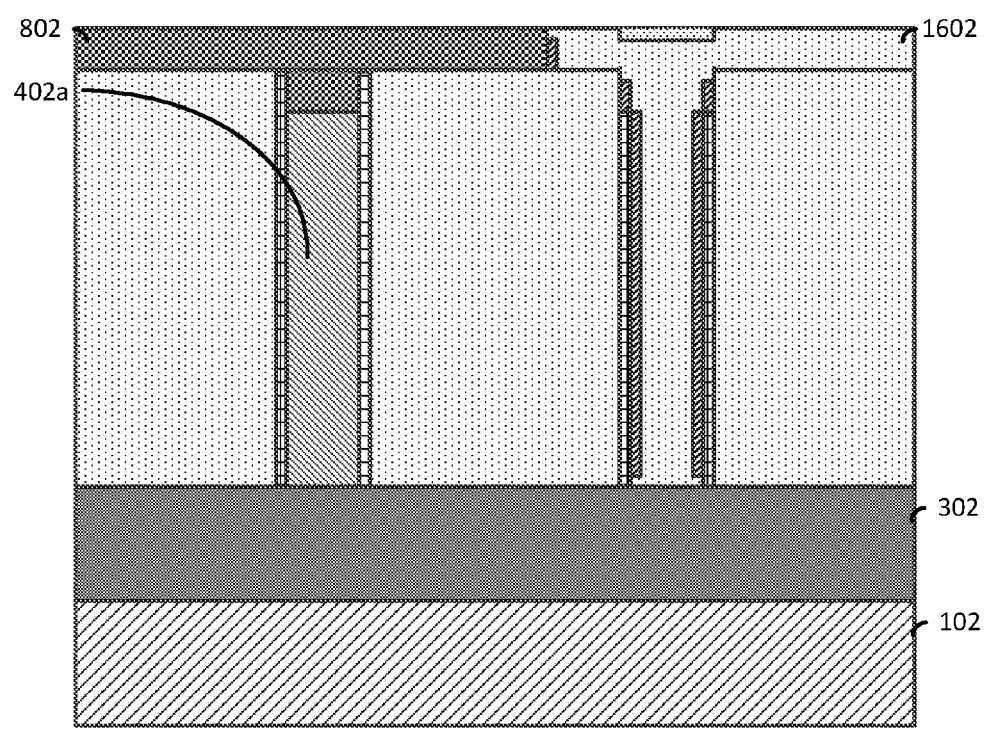
FIGS. 17A and 17B illustrate cut-away views following a planarization process that selectively stops when the sacrificial liner layer or the dielectric fill layer is exposed.
Figure 17B:
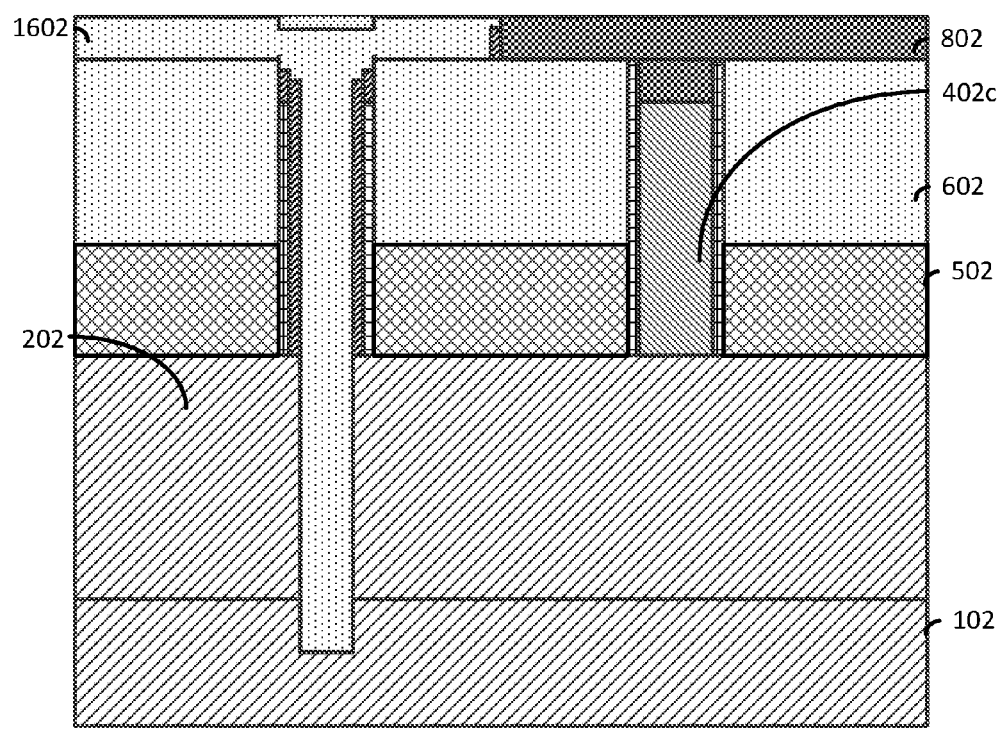

FIGS. 17A and 17B illustrate cut-away views following a planarization process that selectively stops when the sacrificial liner layer 802 or the dielectric fill layer 1602 is exposed. The planarization process can include, for example, chemical mechanical polishing.

Figure 18A:
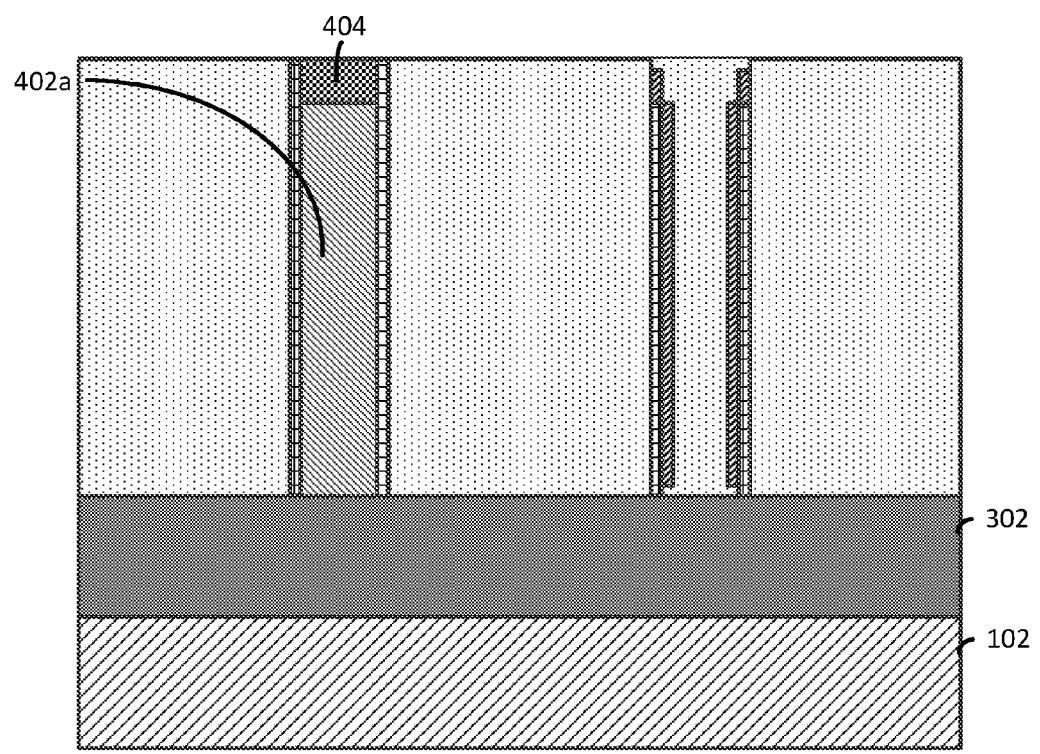
FIGS. 18A and 18B illustrate cut-away views following a non-selective planarization process that can include for example, reactive ion etching processes.
Figure 18B:
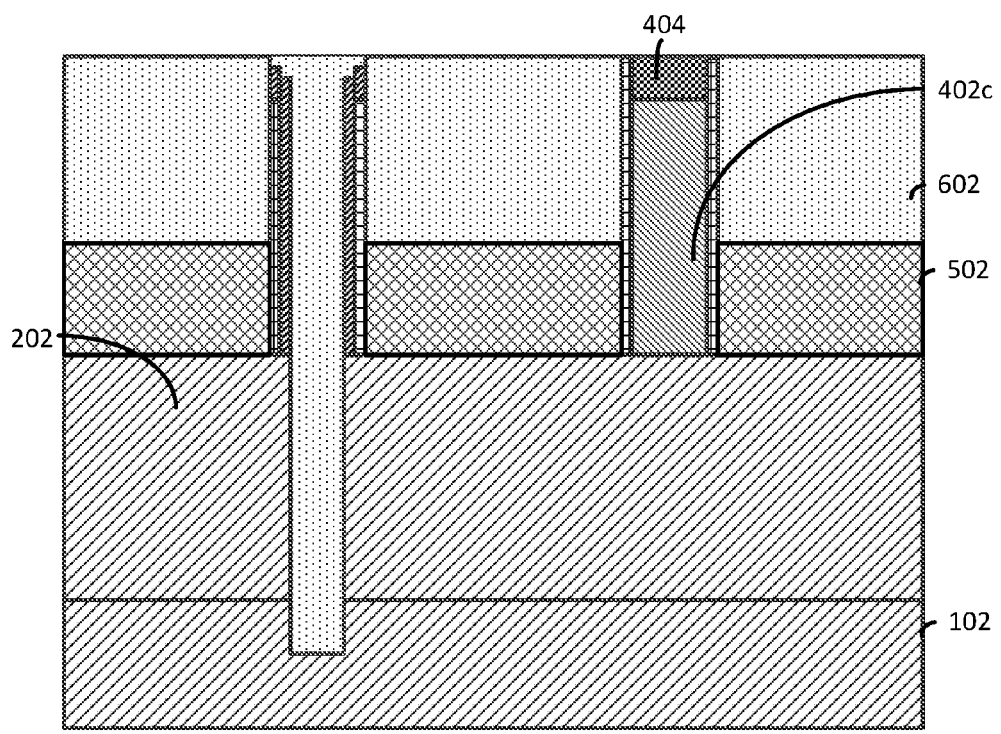

FIGS. 18A and 18B illustrate cut-away views following a non-selective planarization process that can include for example, reactive ion etching processes. The planarization process removes exposed portions of the sacrificial liner layer 802 and the dielectric fill layer 1602 to expose portions of the gate caps 404. Is some exemplary embodiments, the non-selective planarization process can leave a thin layer of the sacrificial liner layer 802 on the active regions.

Figure 19A:
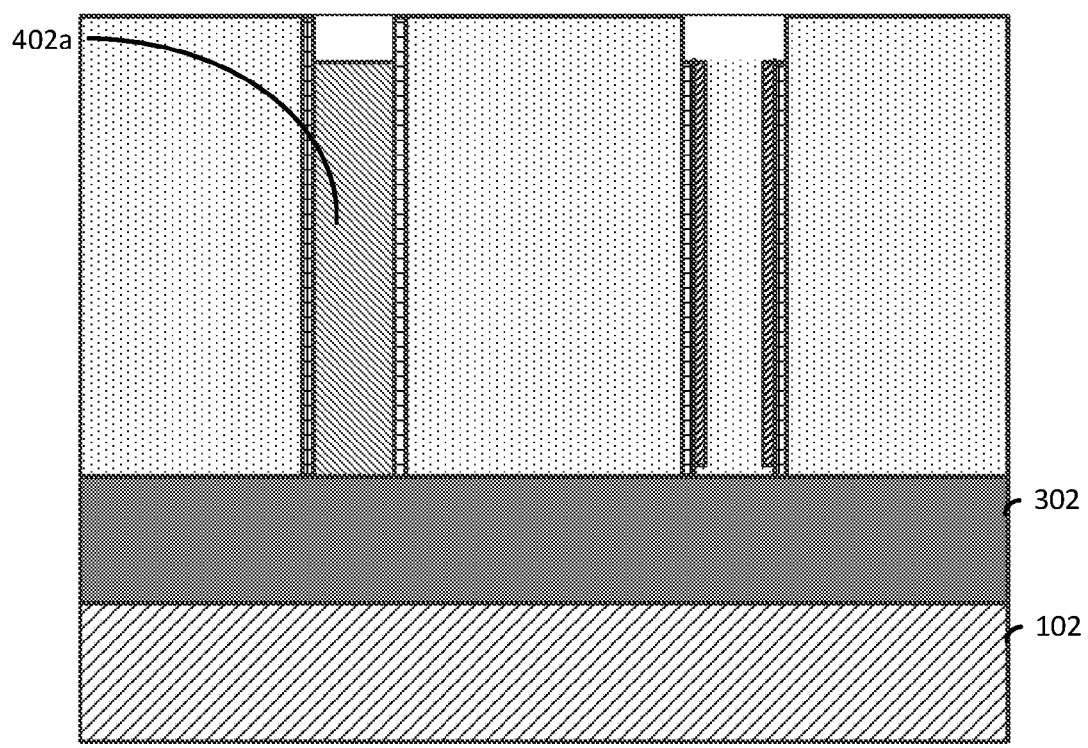
FIGS. 19A and 19B illustrate cut-away views following a selective etching process that removes exposed portions of the gate caps (of FIGS. 18A and 18B) and exposes portions of the sacrificial gates.
Figure 19B:
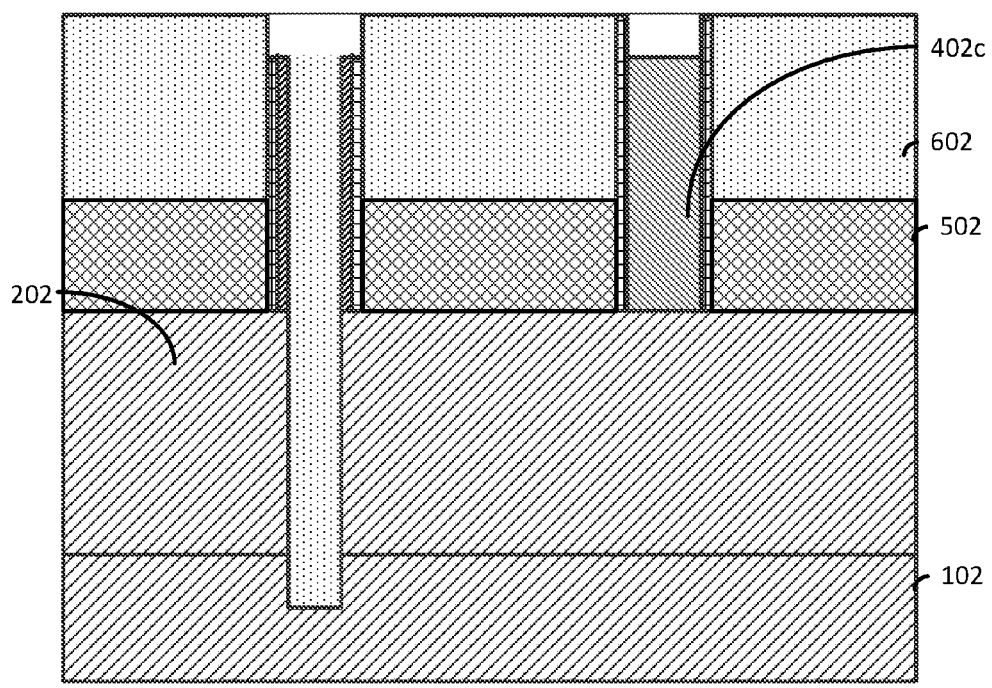

FIGS. 19A and 19B illustrate cut-away views following a selective etching process that removes exposed portions of the gate caps 404 (of FIGS. 18A and 18B) and exposes portions of the sacrificial gates 402. The etching process can include, for example, a reactive ion etching process.

Figure 20A:
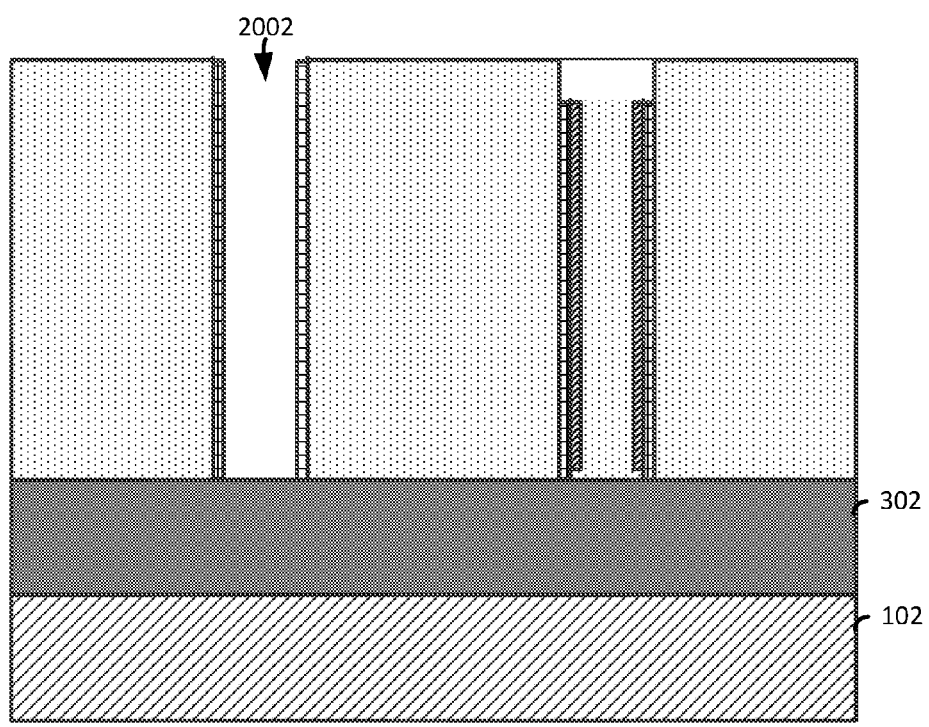
FIGS. 20A and 20B illustrate cut-away views following another selective etching process that removes the sacrificial gates (of FIGS. 19A and 19B) to form cavities that expose channel regions of the fins.
Figure 20B:
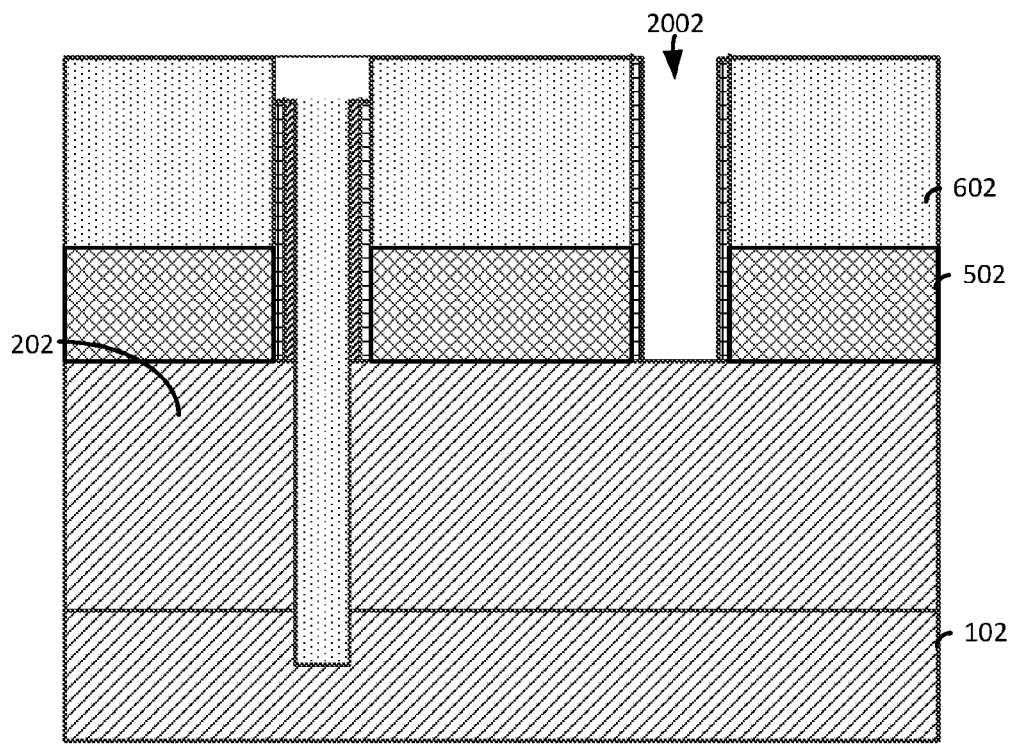

FIGS. 20A and 20B illustrate cut-away views following another selective etching process that removes the sacrificial gates 402 (of FIGS. 19A and 19B) to form cavities 2002 that expose channel regions of the fins 202. The sacrificial gates 402 can be removed by performing a dry etch process, for example, ME, followed by a wet etch process. The wet etch process is selective to (will not substantially etch) the spacers 406 and the inter-level dielectric material 602. The chemical etch process can include, but is not limited to, hot ammonium hydroxide (NH4OH) or tetramethylammonium hydroxide (TMAH).

Figure 21A:
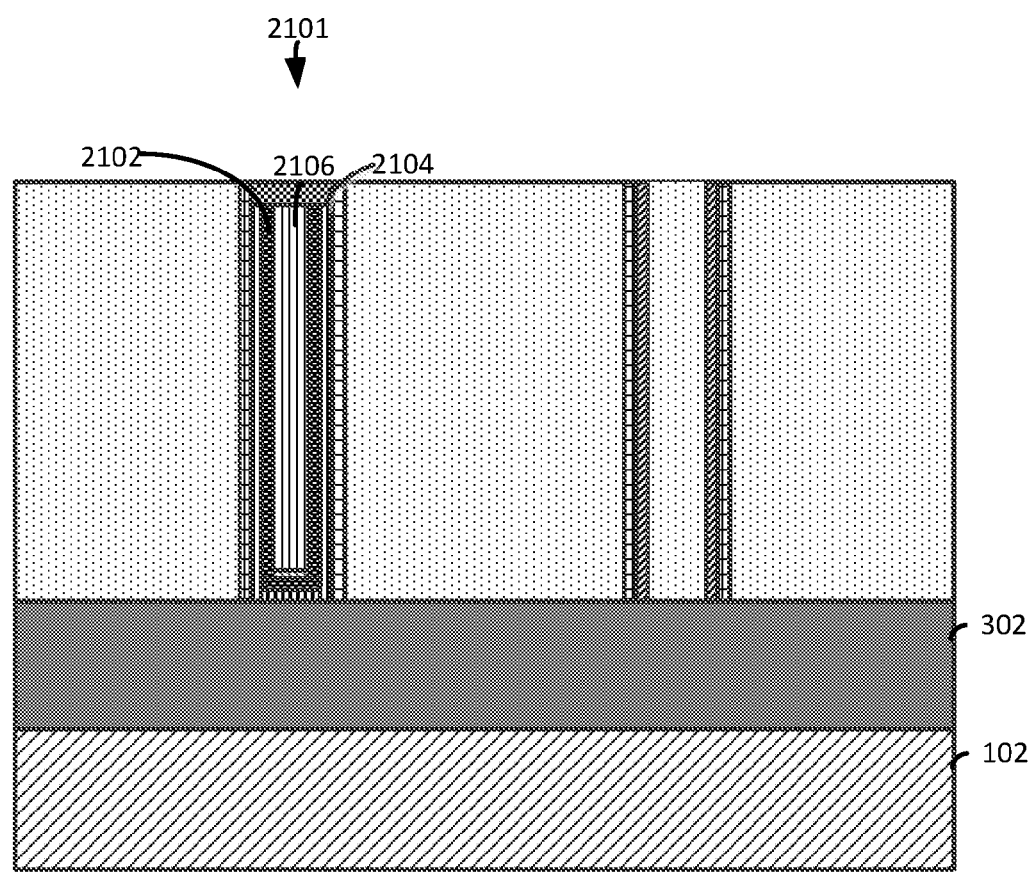
FIG. 21A illustrates a cut-away view along the line C-C (of FIG. 21C)
Figure 21B:
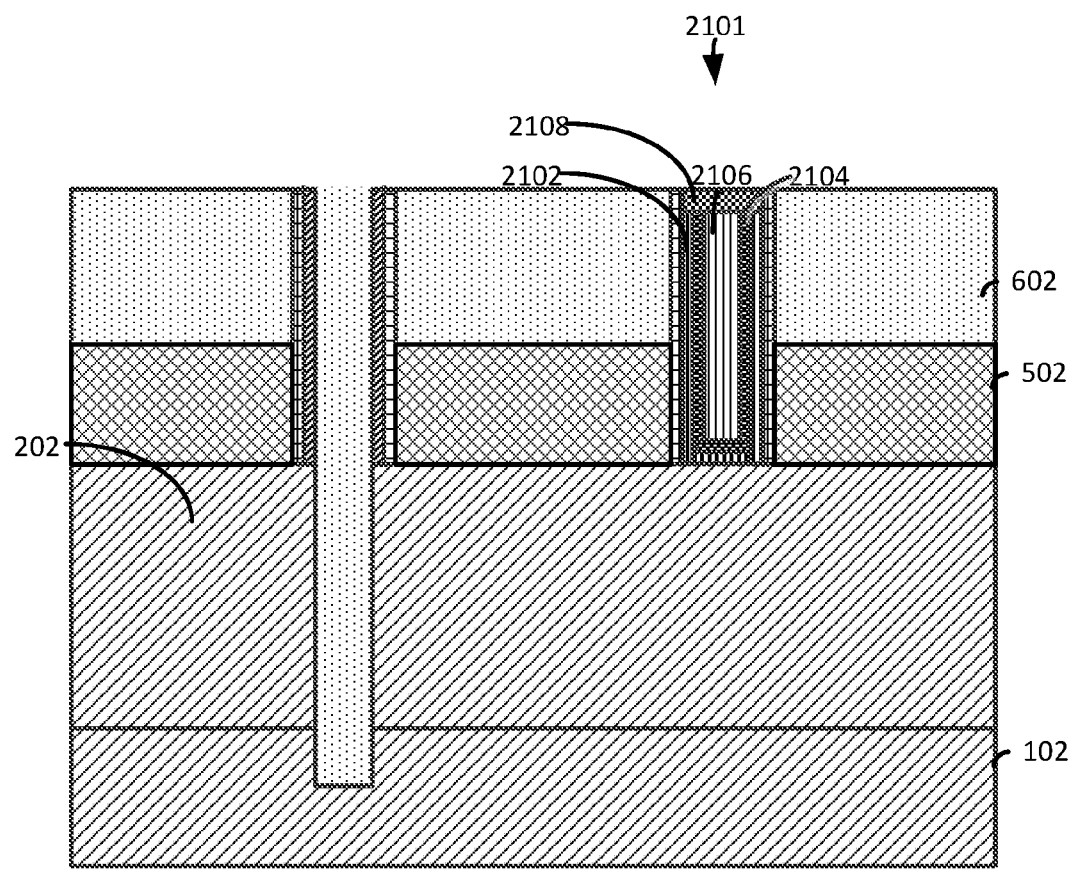
FIG. 21B illustrates a cut-away view along the line D-D (of FIG. 21C) following the formation of replacement gate stacks (gate stacks).
Figure 21C:
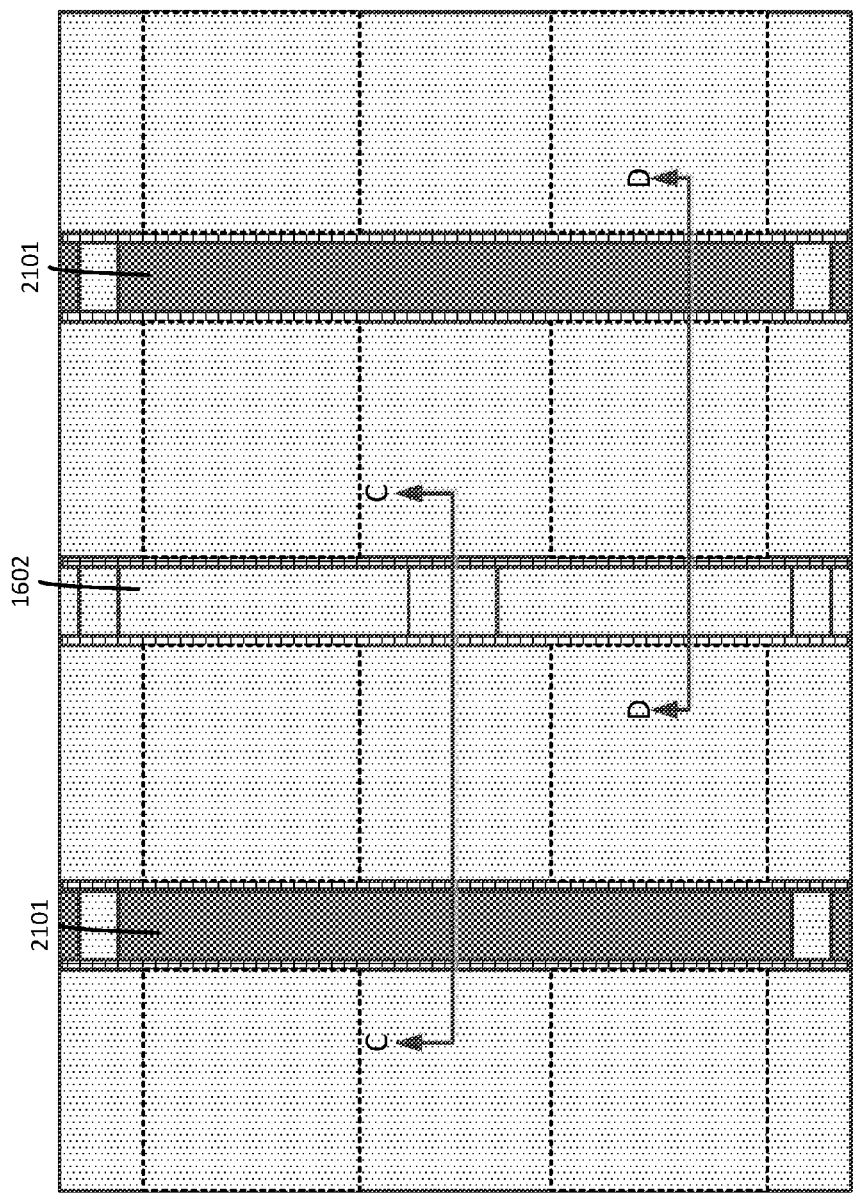

FIG. 21A illustrates a cut-away view along the line C-C (of FIG. 21C) and FIG. 21B illustrates a cut-away view along the line D-D (of FIG. 21C) following the formation of replacement gate stacks (gate stacks) 2101. FIG. 21C illustrates a top view of the gate stacks 2101.

The gate stack 2101 include high-k metal gates formed, for example, by filling the cavity 2002 (of FIGS. 20A and 20B) with one or more gate dielectric 2102 materials, one or more workfunction metals 2104, and one or more metal gate conductor 2106 materials. The gate dielectric 2102 material(s) can be a dielectric material having a dielectric constant greater than 3.9, 7.0, or 10.0. Non-limiting examples of suitable materials for the dielectric 2102 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric 2102 materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) 2104 can be disposed over the gate dielectric 2102 material. The type of work function metal(s) 2104 depends on the type of transistor and can differ between the nFET and pFET devices. Non-limiting examples of suitable work function metals 2104 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

The gate conductor 2106 material(s) is deposited over the gate dielectric 2102 materials and work function metal(s) 2104 to form the gate stack 2101. Non-limiting examples of suitable conductive metals include aluminum (Al), platinum (Pt), gold (Au), tungsten (W), titanium (Ti), or any combination thereof. The gate conductor 2106 material(s) can be deposited by a suitable deposition process, for example, CVD, PECVD, PVD, plating, thermal or e-beam evaporation, and sputtering.

Following the deposition of the gate dielectric 2102 materials, the work function metal(s) 2104, and the gate conductor 2106 material(s), planarization process, for example, chemical mechanical planarization (CMP), is performed to remove the overburden of the deposited gate materials and form the gate stack 2101. A gate cap can be formed on the gate stack 2101 in some embodiments.

The illustrated exemplary methods described above provide for the formation of finFET devices that have fins that remain strained during the fin cutting process.

FIGS. 22-29B illustrate another exemplary method for forming FET devices. In the method described in FIGS. 22-29, the fins are cut during the replacement metal gate formation process, and result in the strain on the fins 202 being preserved during the fin cut process. The gates are also cut during the replacement metal gate formation process, which avoids the undesirable growth or merging of the source/drain regions proximate to the distal ends of the cut gates.

Figure 22:
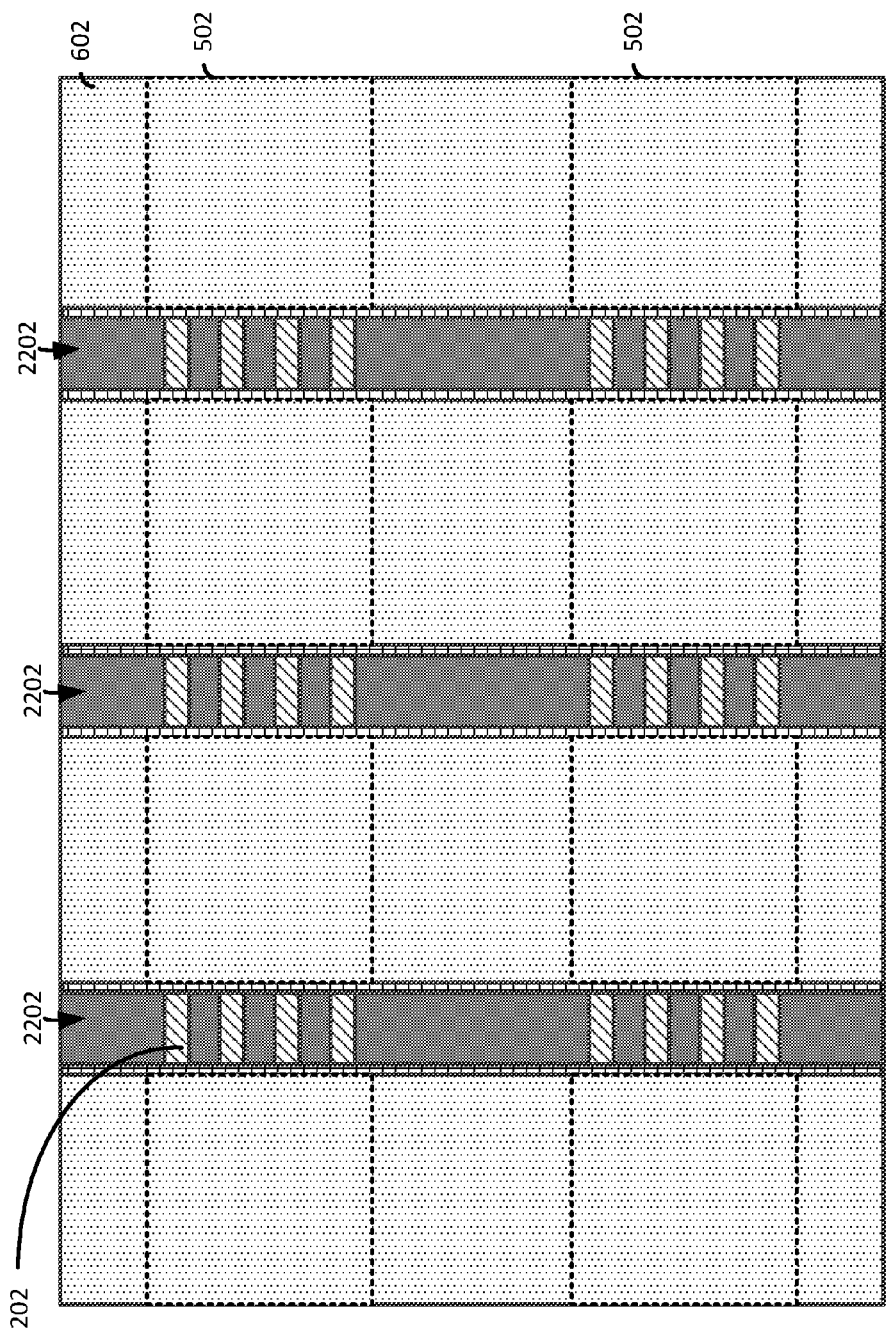

FIG. 22 illustrates a top view following the removal of the sacrificial gates 402 (of FIG. 6B) to form cavities 2202 that expose channel regions of the fins 202. The methods described above in FIGS. 1-6B can be performed prior to removing the sacrificial gates 402 to result in the formation of the cavities 2202.

Figure 23A:
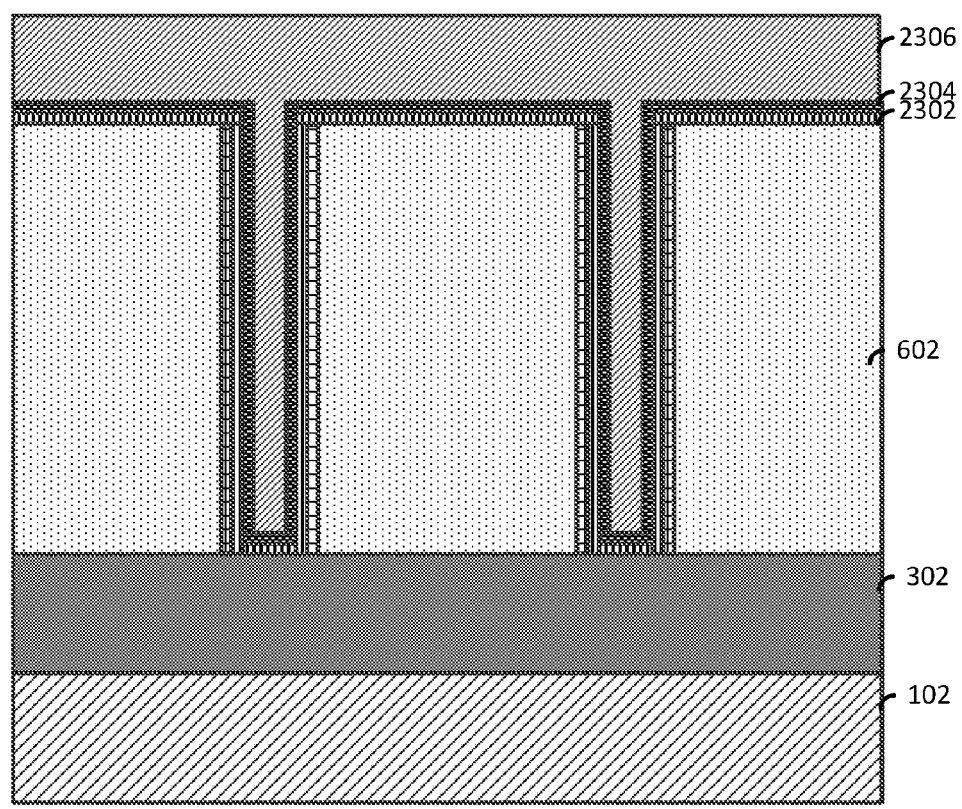
FIG. 23A illustrates a cut-away view along the line C-C (of FIG. 23C)
Figure 23B:
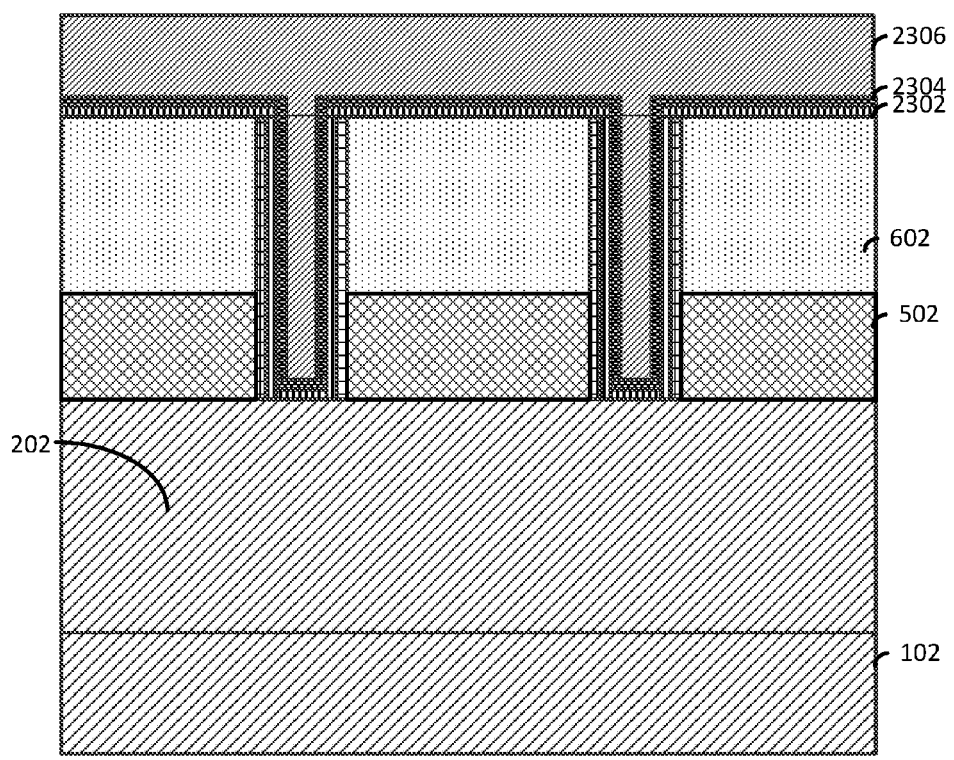
FIG. 23B illustrates a cut-away view along the line D-D (of FIG. 23C) following the deposition of a gate dielectric layer in the cavities.

FIG. 23A illustrates a cut-away view along the line C-C (of FIG. 23C) and FIG. 23B illustrates a cut-away view along the line D-D (of FIG. 23C) following the deposition of a gate dielectric layer 2302 in the cavities 2202 that is similar to the gate dielectric 2102 (of FIG. 21) described above. A sacrificial liner layer 2304 is deposited on the gate dielectric layer 2302. The sacrificial liner layer 2304 includes a metallic material such as, for example, TiN, TiC, or another metallic material. Following the deposition of the sacrificial liner layer 2304, an amorphous semiconductor material 2306 is deposited in the cavities 2202. The amorphous semiconductor material 2306 can include, for example, an amorphous Si material (a-Si).

High temperature reliability annealing is performed after the deposition of the semiconductor material 2306. The annealing is performed prior to the cutting of the fins 202 to prevent relaxation of a cut fin end during exposure to high temperatures.

Figure 23C:
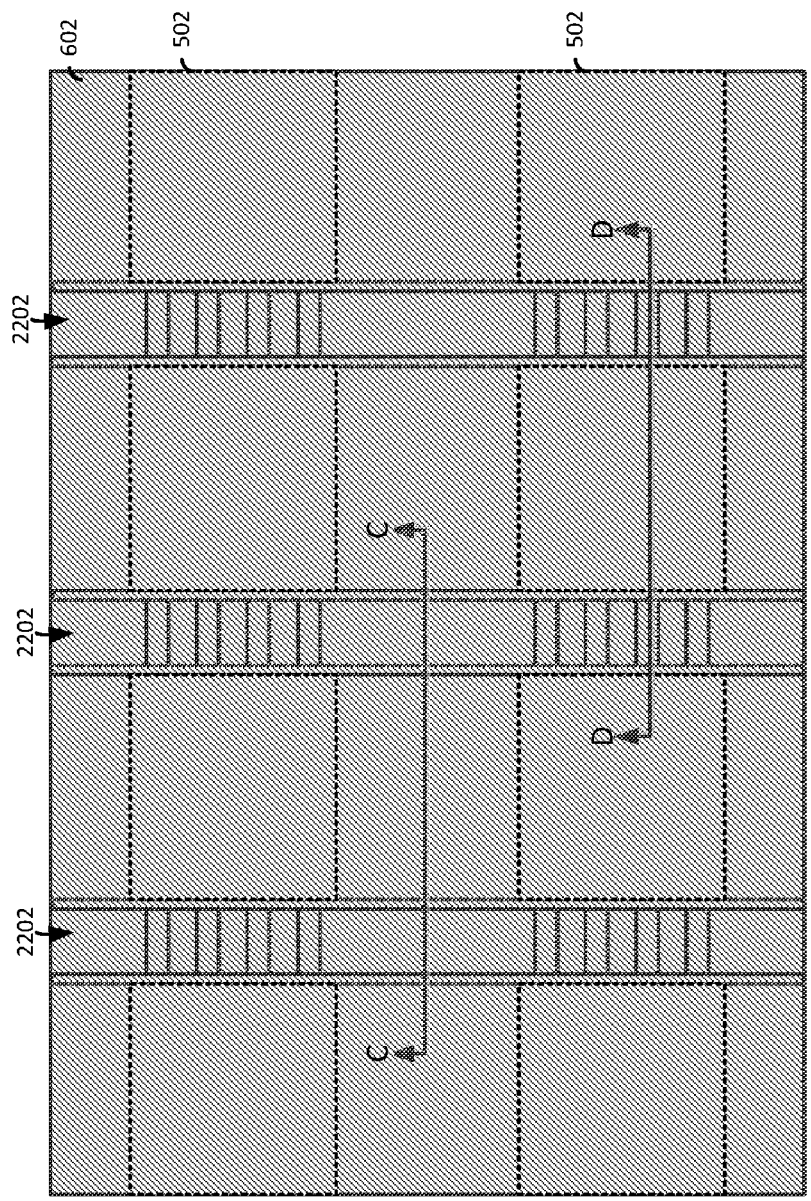
FIG. 23C illustrates a top view following the deposition of the amorphous semiconductor material.

FIG. 23C illustrates a top view following the deposition of the amorphous semiconductor material 2306.

Figure 24A:
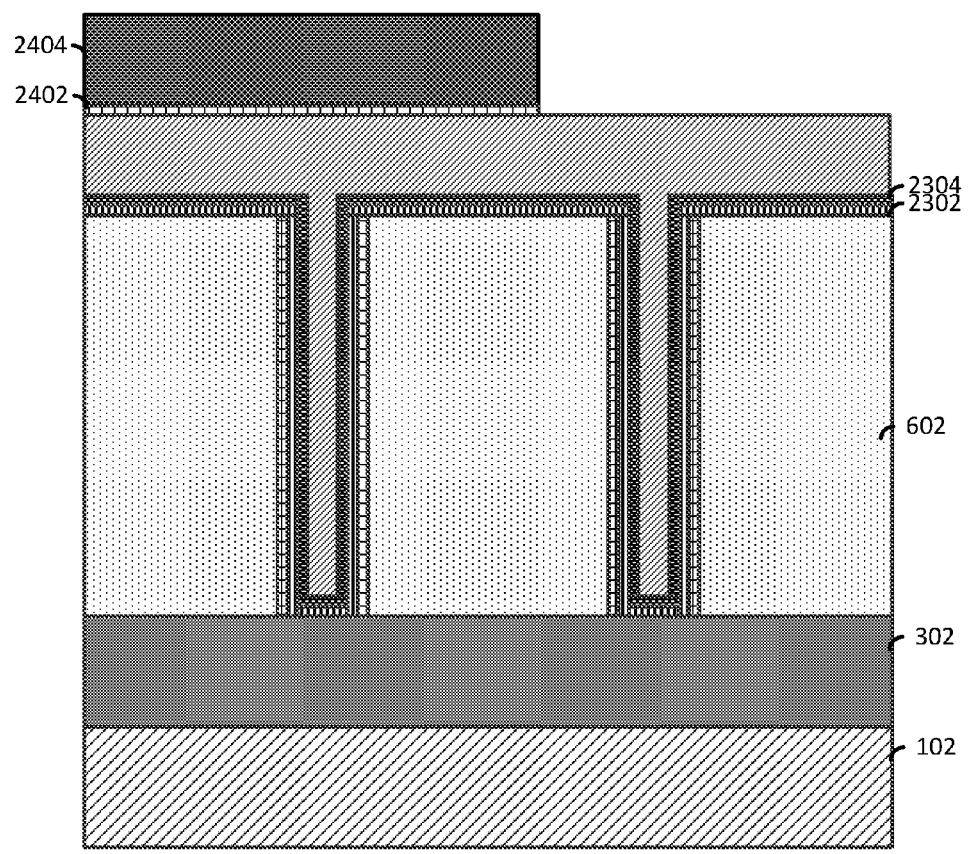
FIG. 24A illustrates a cut-away view along the line C-C (of FIG. 24C).
Figure 24B:
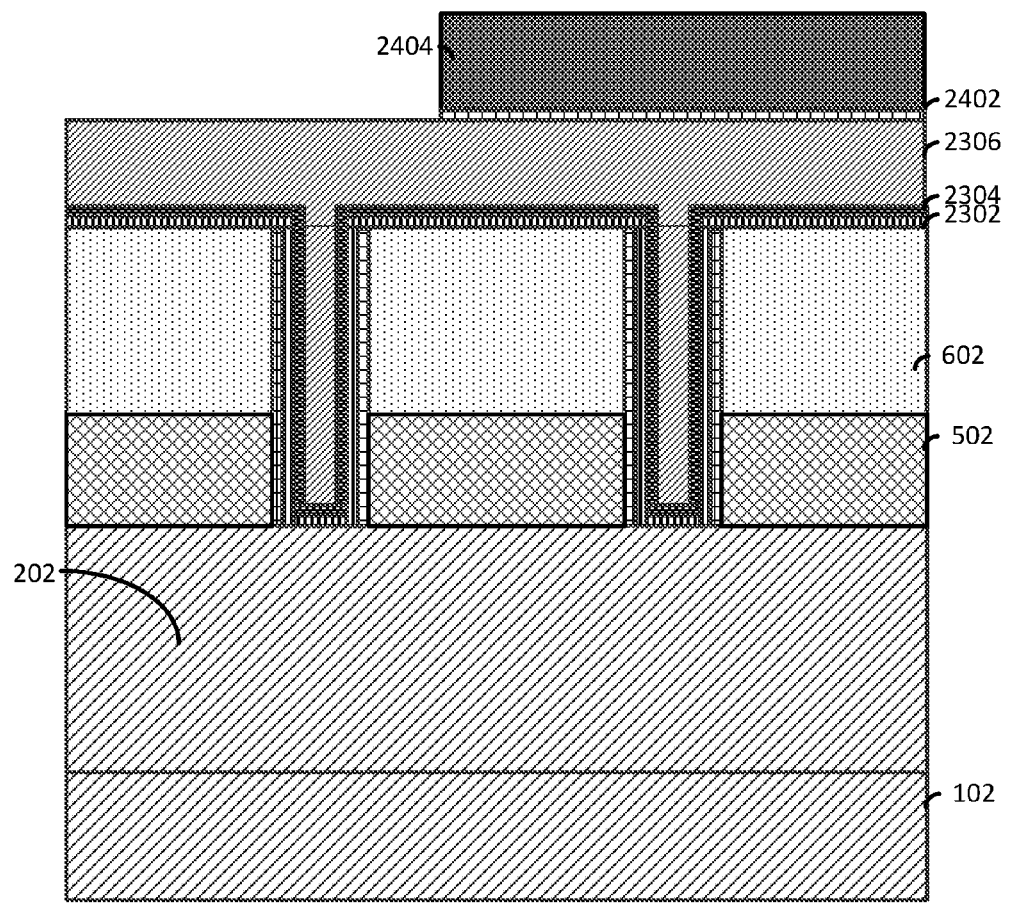
FIG. 24B illustrates a cut-away view along the line D-D (of FIG. 24C) following the deposition of another sacrificial liner layer over the amorphous semiconductor material, and the patterning of the sacrificial liner layer.
Figure 24C:
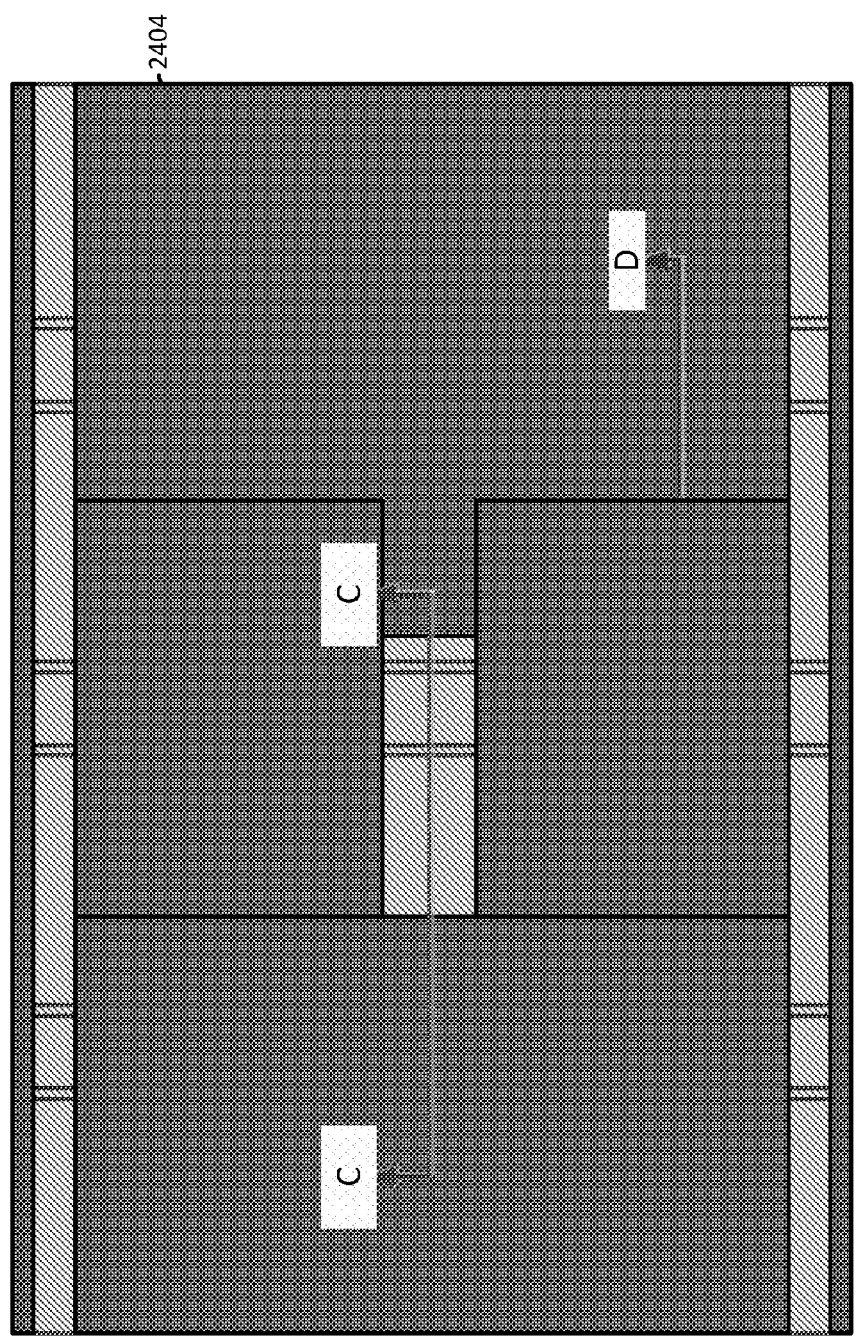
FIG. 24C illustrates a top view of the mask.

FIG. 24A illustrates a cut-away view along the line C-C (of FIG. 24C) and FIG. 24B illustrates a cut-away view along the line D-D (of FIG. 24C) following the deposition of another sacrificial liner layer 2402 over the amorphous semiconductor material 2306, and the patterning of the sacrificial liner layer 2402. In this regard, the sacrificial liner layer 2402 can include, for example, a nitride material or other material that can be etched selectively to oxide, silicon and the sacrificial metal liner materials. The mask 2402 is patterned on the sacrificial liner layer 2402. A selective etching process is performed, such as, for example, reactive ion etching that removes exposed portions of the sacrificial liner layer 2402 and exposes portions of the amorphous semiconductor material 2306. FIG. 24C illustrates a top view of the mask 2402.

Figure 25A:
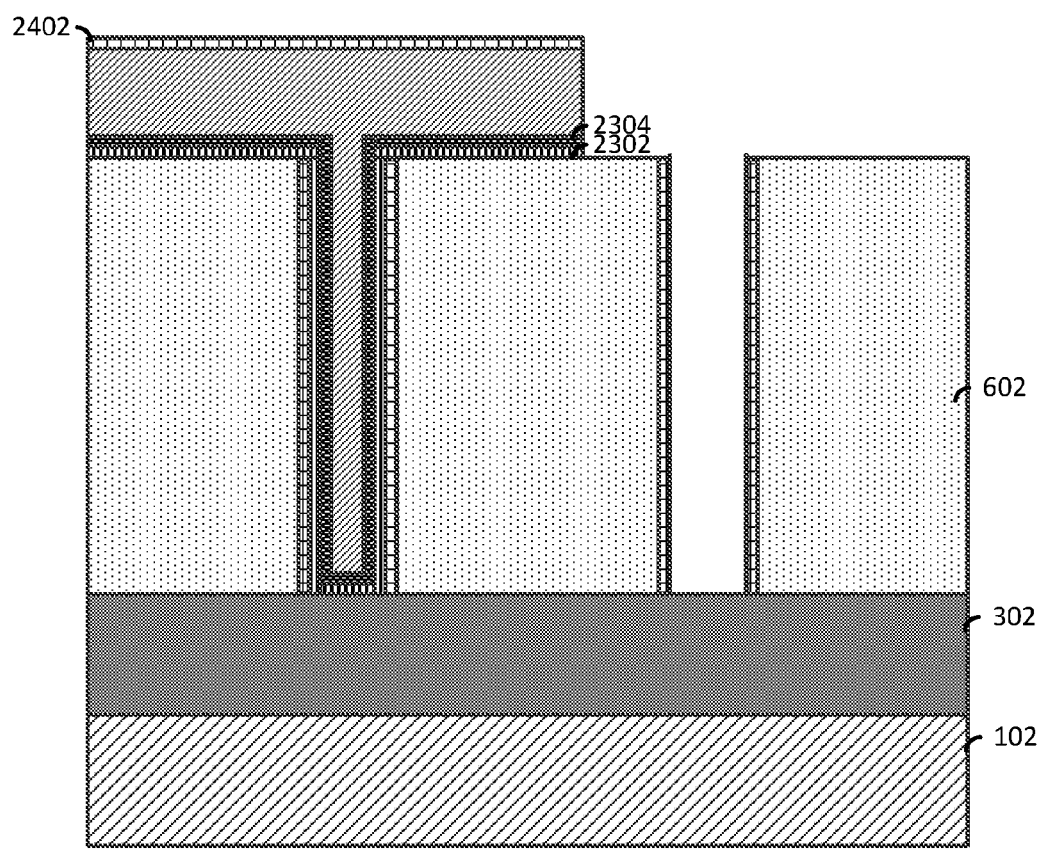
FIGS. 25A and 25B illustrate cut-away views following the removal of exposed portions of the sacrificial liner layer, the amorphous semiconductor material, the sacrificial liner layer, and the gate dielectric layer.
Figure 25B:
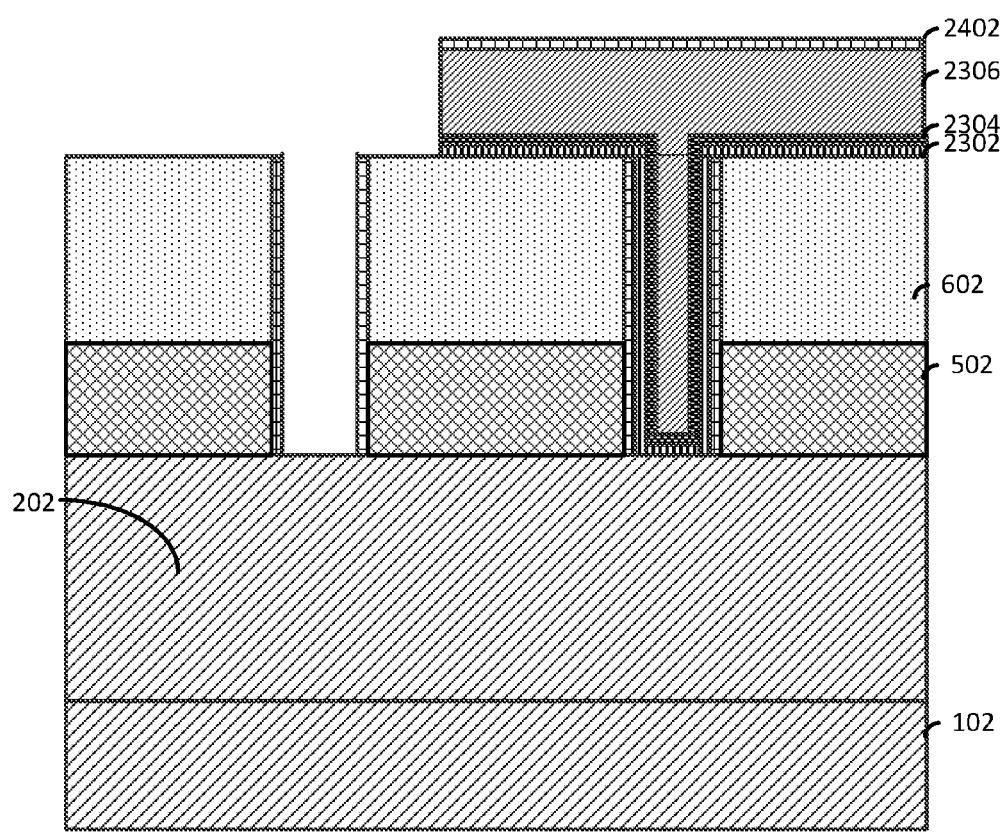

FIGS. 25A and 25B illustrate cut-away views following the removal of exposed portions of the sacrificial liner layer 2402, the amorphous semiconductor material 2306, the sacrificial liner layer 2304, and the gate dielectric layer 2302. The first etching process can include an anisotropic plasma RIE of the amorphous silicon 2306 down to the sacrificial liner layer 2304 to maintain required critical dimensions of the gate and fin cuts. The second etching process can include, for example, a wet chemistry (e.g., HCl) process that removes exposed portions of the sacrificial liner layer 2304. A final isotropic or directional etch can be performed to remove the exposed portions of the gate dielectric layer 2302.

A sidewall spacer deposition and spacer pullback process can be used in a similar manner as discussed above to maintain desired critical dimensions.

Figure 26A:
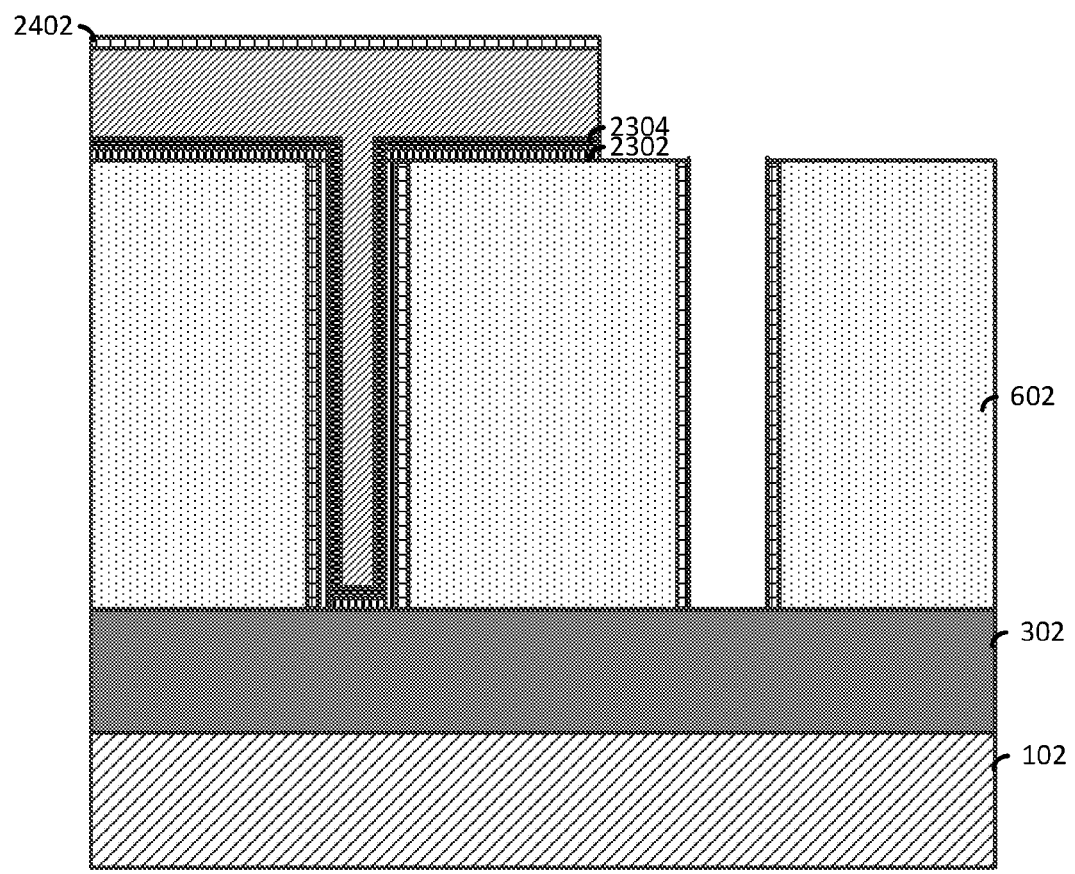
FIGS. 26A and 26B illustrate cut-away views following a selective anisotropic etching process that removes exposed portions of the fins to form a cavity.
Figure 26B:
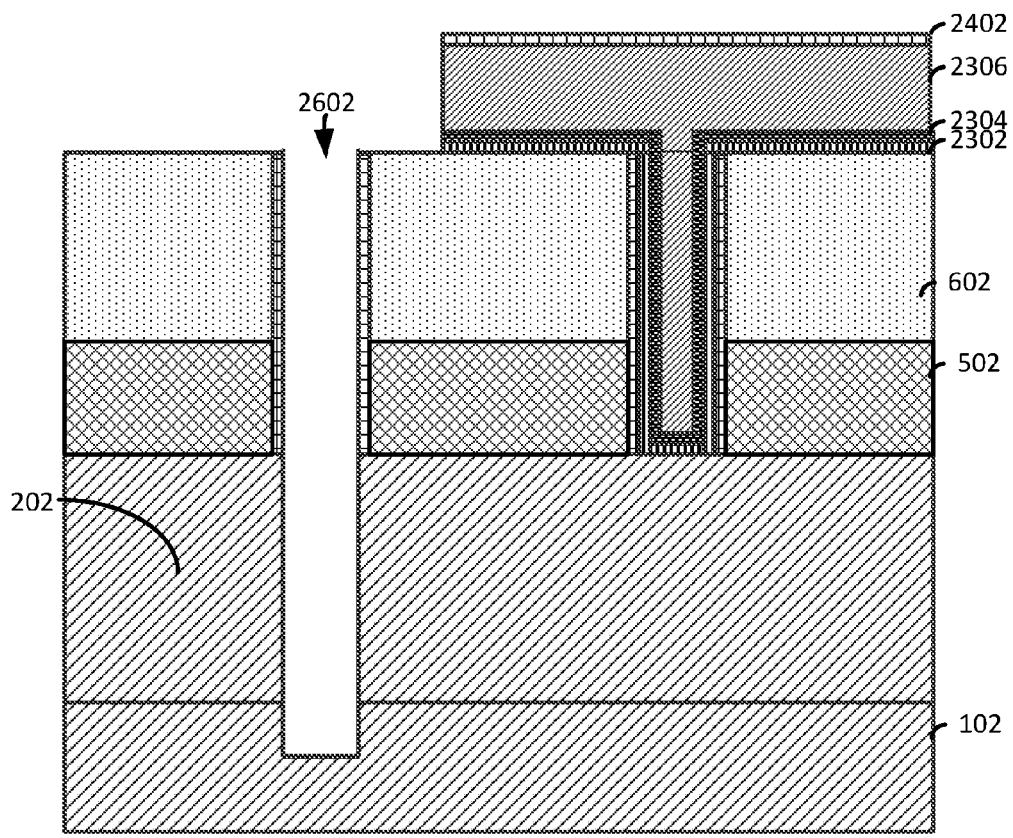

FIGS. 26A and 26B illustrate cut-away views following a selective anisotropic etching process that removes exposed portions of the fins 202 to form a cavity 2602 that has a depth that can be defined by the substrate 102.

Figure 27A:
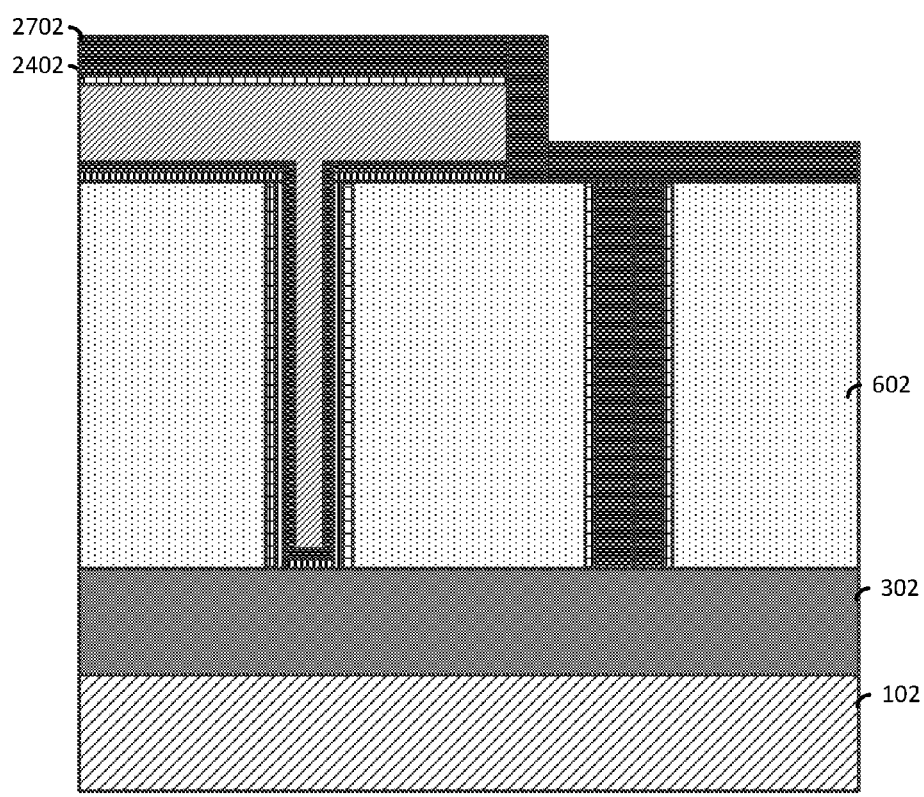
FIGS. 27A and 27B illustrate cut-away views following the deposition of a conformal liner layer in the cavity (of FIG. 26B).
Figure 27B:
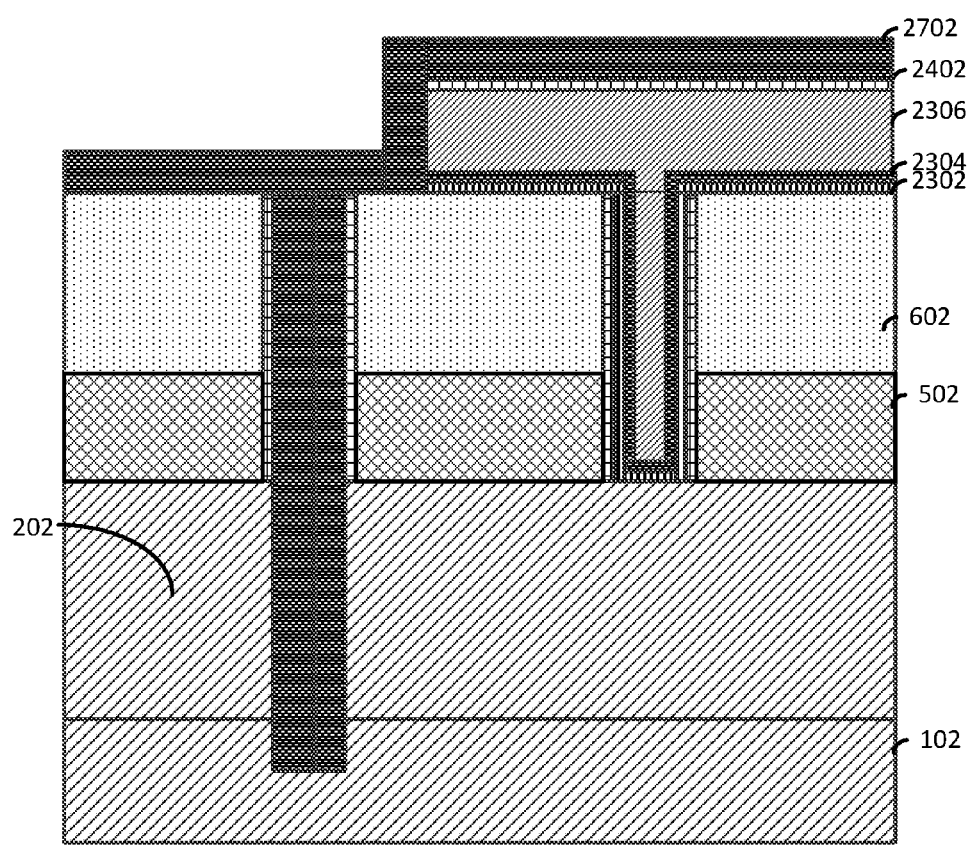

FIGS. 27A and 27B illustrate cut-away views following the deposition of a conformal liner layer 2702 in the cavity 2602 (of FIG. 26B). The conformal liner layer 2702 can include, for example, a nitride material or an alternative liner material.

Figure 28A:
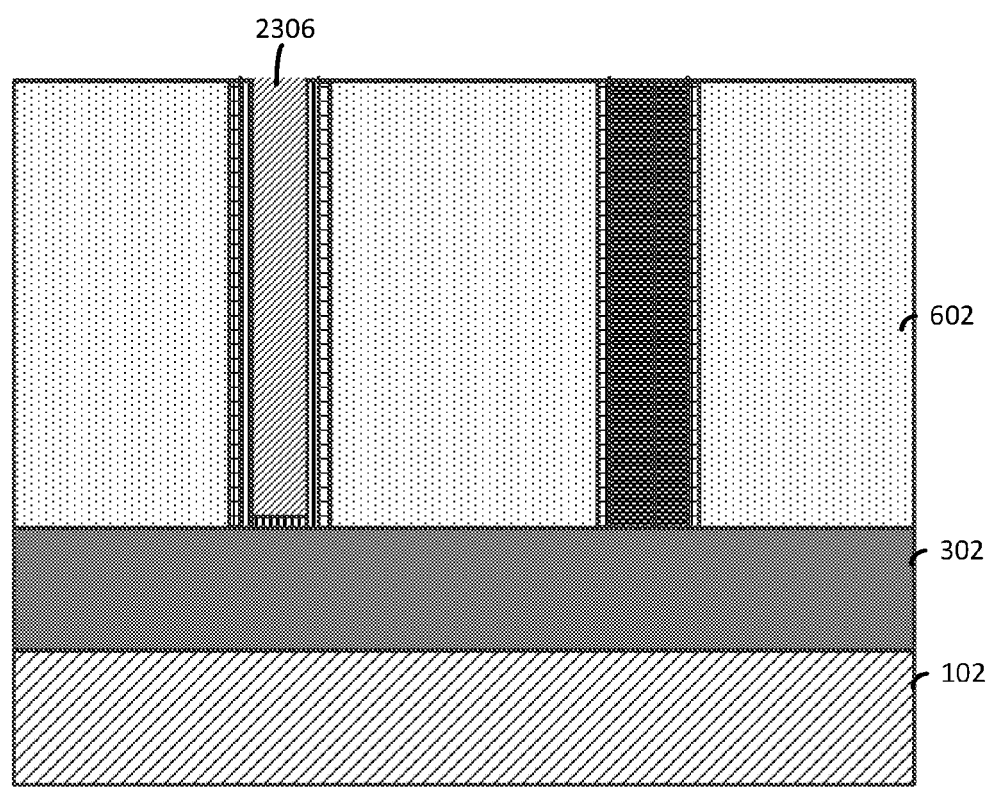
FIGS. 28A and 28B illustrate cut-away views following a planarization process that removes portions of the gate dielectric layer, the sacrificial liner layer, the amorphous semiconductor material, the sacrificial liner layer, and the conformal liner layer.
Figure 28B:
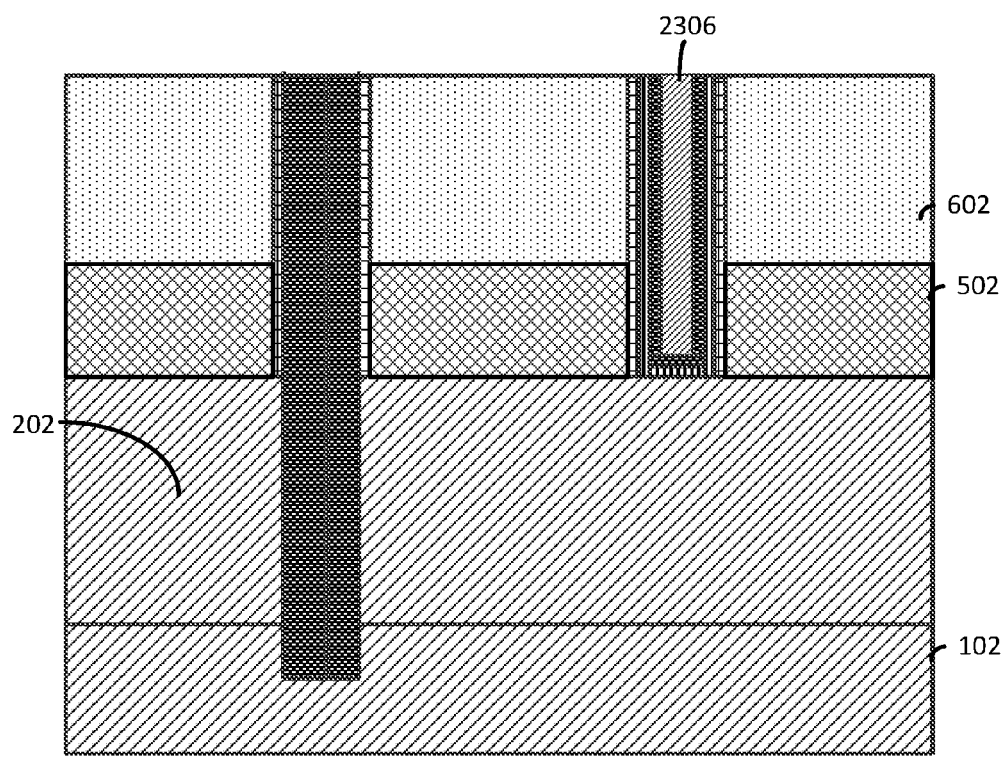

FIGS. 28A and 28B illustrate cut-away views following a planarization process that removes portions of the gate dielectric layer 2302, the sacrificial liner layer 2304, the amorphous semiconductor material 2306, the sacrificial liner layer 2402, and the conformal liner layer 2702. The planarization process can include, for example, chemical mechanical polishing.

Figure 29A:
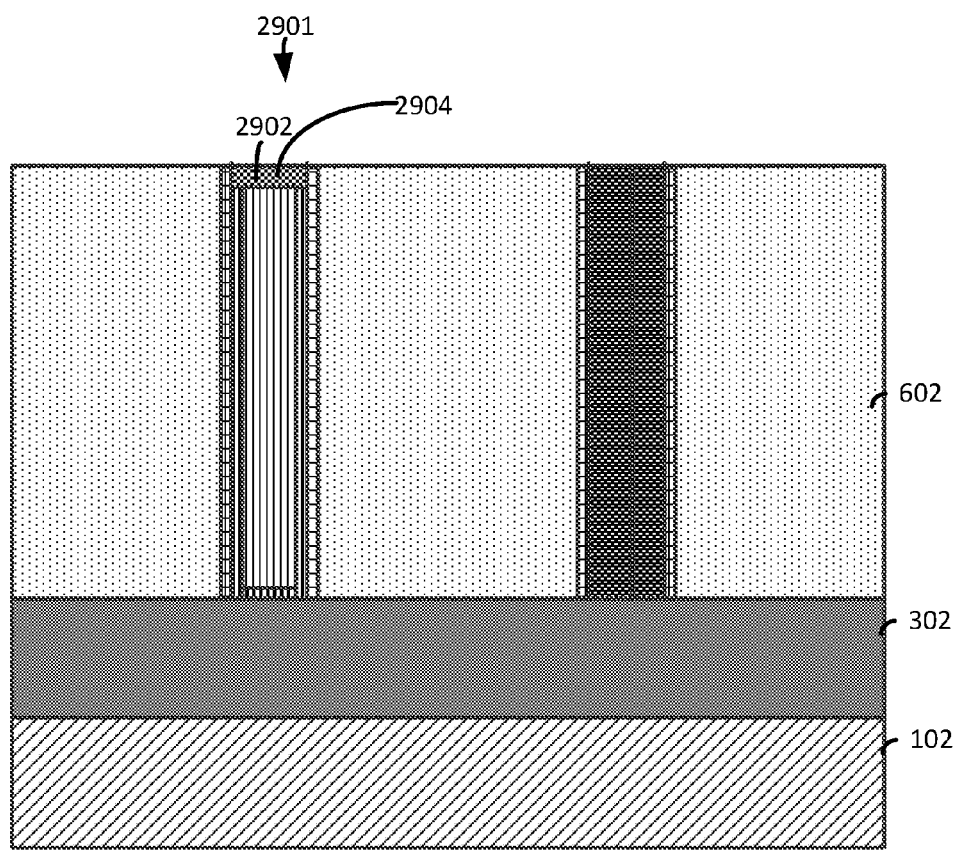
FIG. 29A illustrates a cut-away view along the line C-C (of FIG. 29C)
Figure 29B:
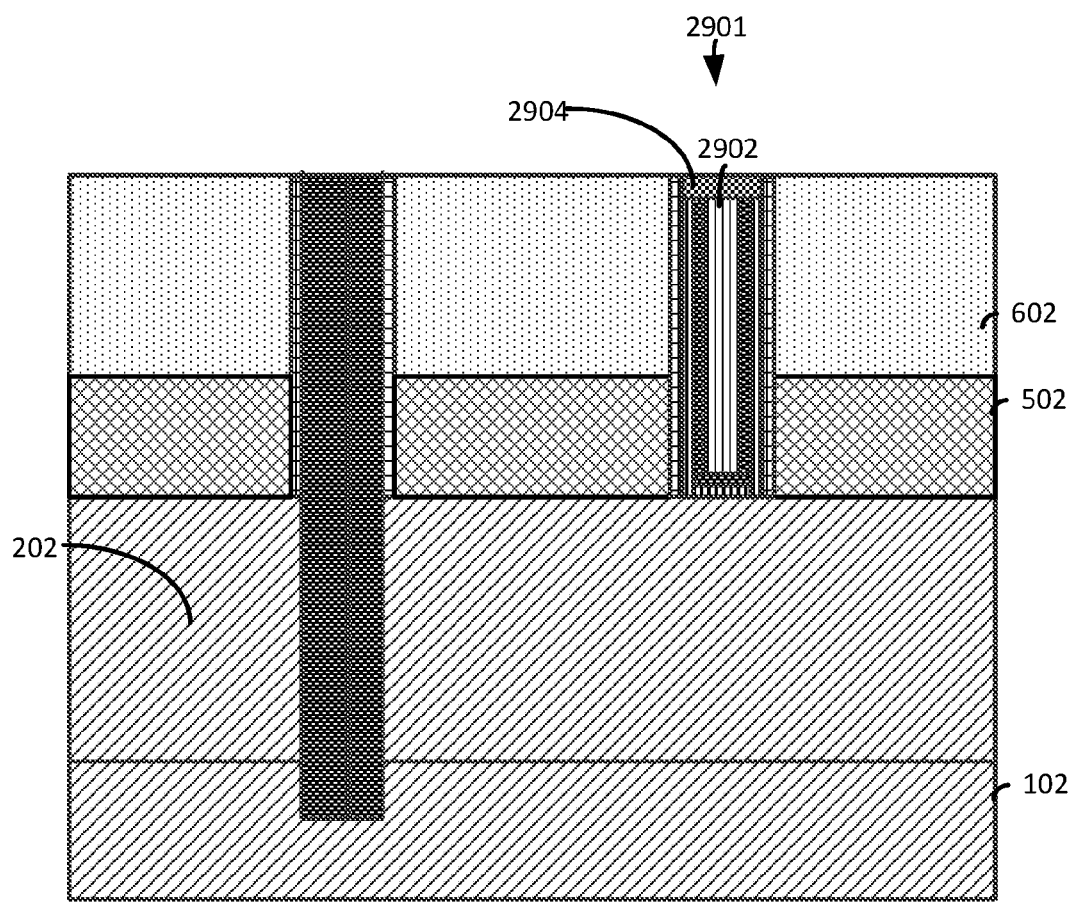
Figure 29C:
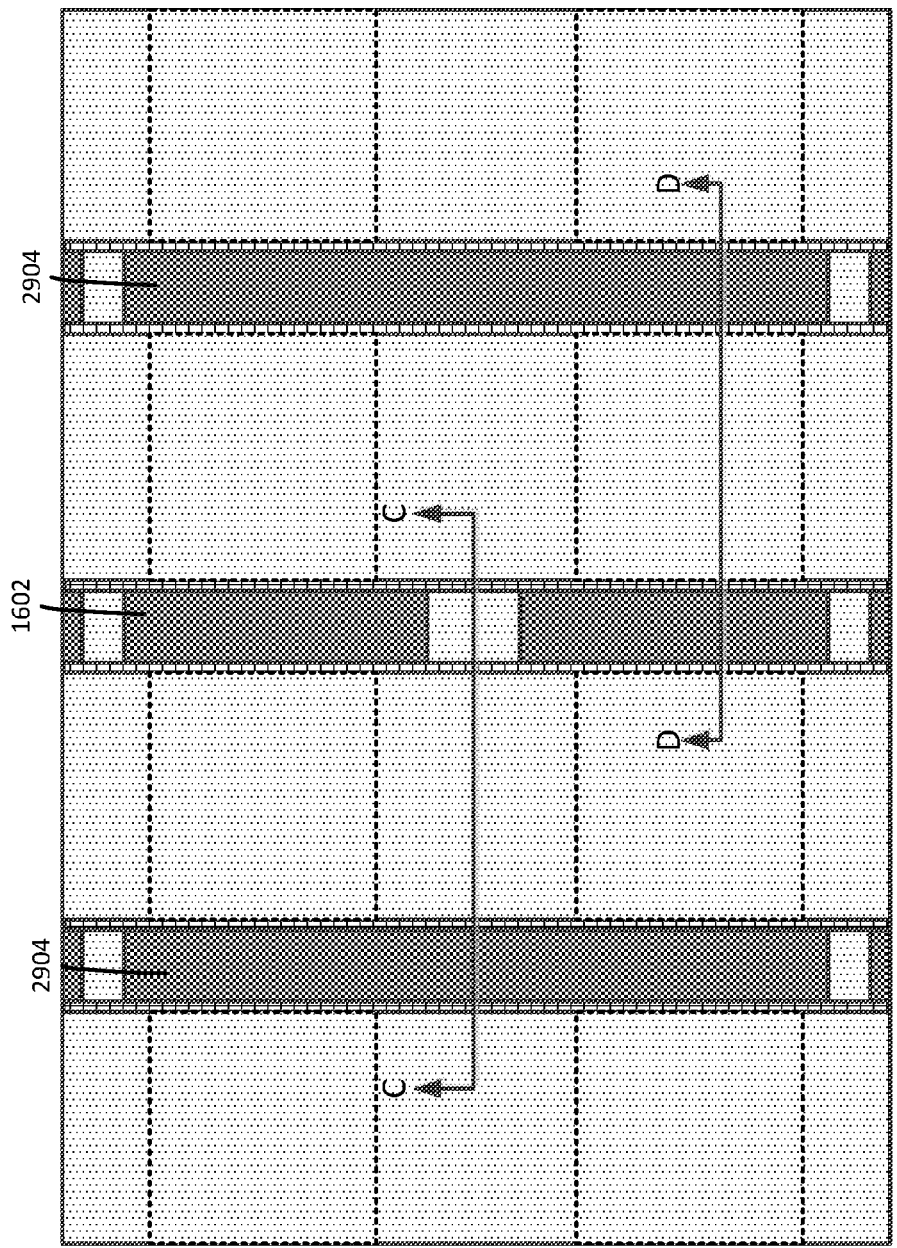
FIG. 29C illustrates a top view following the formation of the gate stacks.

FIG. 29A illustrates a cut-away view along the line C-C (of FIG. 29C) and FIG. 29B illustrates a cut-away view along the line D-D (of FIG. 29C) following the removal of the remaining amorphous semiconductor material 2306 (of FIGS. 28A and 28B) and the formation of a gate conductor 2902. The amorphous semiconductor material 2306 can be removed by any suitable selective etching process. The gate conductor 2902 is formed using a similar process as discussed above in FIGS. 21A and 21B. A gate cap 2904 can be formed on the gate stacks 2901. FIG. 29C illustrates a top view following the formation of the gate stacks 2901.

The illustrated exemplary methods described above provide for the formation of finFET devices that have fins that remain strained during the fin cutting process.

Figure 30:
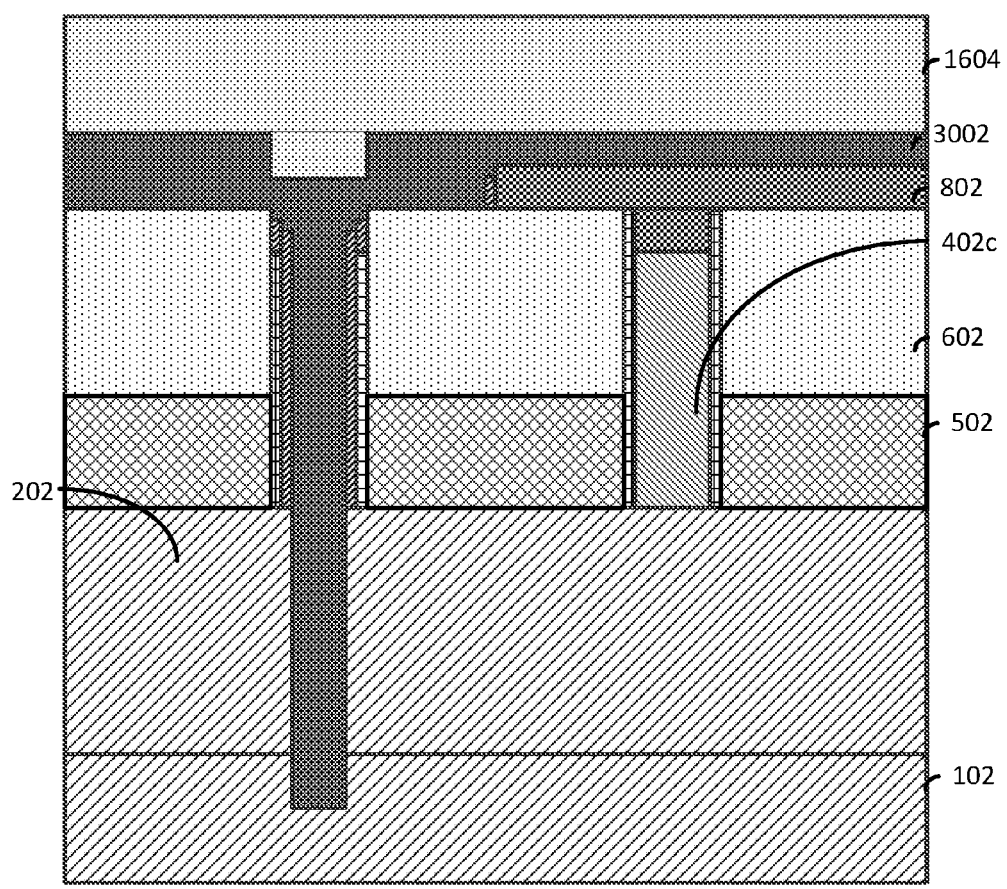
FIG. 30 illustrates another exemplary embodiment that includes a fill layer that induces strain on the fins.

FIG. 30 illustrates another exemplary embodiment of the methods described above. In this regard, FIG. 30 is similar to FIG. 16b described above. In FIG. 16A, a dielectric fill layer 1602 is formed in the cavities 1202b (of FIG. 15B). However, in FIG. 30 a fill layer 3002 is deposited in the cavities 1202b (of FIG. 15B). The fill layer 3002 can include any suitable fill material such as, for example, SiNx that is operative to induce a strain in the fin 202. In the illustrated exemplary embodiment, the fill layer 3002 can be used to induce a tensile strain on the fin 202 (e.g., for nFET devices) if the fill layer is deposited using, for example, atomic layer deposition with a remote plasma process or a compressive strain on the fin 202 (e.g., for pFET devices) if the fill layer 3002 is deposited using atomic layer deposition with a direct plasma process.

If different types of devices are arranged on the substrate 102, and dissimilar fill layers 3002 are desired for respective nFET and pFET devices, the masks 902 and 1002 can be patterned along with a third mask (not shown) to allow the deposition of different types of fill layers 3002 in nFET and pFET devices.

Following the formation of the fill layer 3002, the methods described above in FIGS. 17A-21C can be performed as described above. The fill layer 3002 can also be used in the embodiments described above in FIGS. 22-29C.

The use of the fill layer 3002 to induce a compressive or tensile strain on the fins 202 often improves the performance characteristics of the devices. In many complementary metal oxide semiconductor (CMOS) devices, a tensile strain is desired in the channel region of a n-type field effect transistor (FET) device (nFET) and a compressive strain is desired in the channel region of a p-type FET device (pFET). Strained channel regions often enhance electron mobility or hole mobility, which improves conductivity through the channel regions of FET devices.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a first fin and a second fin on a substrate;
   forming a sacrificial gate having a gate cap on the first fin and the second fin;
   forming spacers adjacent to sidewalls of the sacrificial gate;
   forming a source/drain region on exposed portions of the first fin and the second fin;
   forming an insulator layer on the source/drain region;
   depositing a sacrificial liner layer on the sacrificial gate and the insulator layer;
   removing portions of the sacrificial liner layer and removing portions of a gate cap to expose portions of the sacrificial gate;
   removing portions of the sacrificial gate and exposed portions of the second fin to form a first cavity and a second cavity, where an exposed portion of the second fin is removed from the second cavity;
   depositing a liner layer in the first cavity and the second cavity;
   removing portions of the liner layer in the second cavity to expose the substrate, and removing portions of the substrate in the second cavity;
   depositing a dielectric fill material in the first and second cavity;
   removing the sacrificial gate; and
   forming a gate stack over a channel region of the first fin.

2. The method of claim 1, further comprising removing portions of the liner layer in the second cavity to expose a portion of the substrate.

3. The method of claim 1, further comprising depositing a planarization layer on the dielectric fill material prior to removing the sacrificial gate.

4. The method of claim 1, wherein the dielectric fill material includes an insulator material.

5. The method of claim 1, wherein the gate cap and the sacrificial liner layer are formed from similar materials.

6. The method of claim 1, further comprising performing a planarization process prior to removing the sacrificial gate.

7. The method of claim 1, wherein the liner layer includes a nitride material.

8. The method of claim 1, wherein the removing portions of the sacrificial liner layer and removing portions of a gate cap to expose portions of the sacrificial gate includes patterning a first mask over portions of the sacrificial gate and the insulator layer.

9. The method of claim 8, wherein the removing portions of the sacrificial liner layer and removing portions of a gate cap to expose portions of the sacrificial gate includes patterning a second mask over portions of the sacrificial gate and the insulator layer.

10. A method for forming a semiconductor device, the method comprising:
    forming a first fin and a second fin on a substrate;
    forming a sacrificial gate on a channel region of the first fin and a channel region of the second fin;
    forming spacers adjacent to sidewalls of the sacrificial gate;
    forming a source/drain region on exposed portions of the first fin and the second fin;
    forming an insulator layer on the source/drain region;
    removing the sacrificial gate to form a cavity that exposes a channel region of the first fin and a channel region of the second fin;
    depositing a gate dielectric layer in the cavity;
    depositing a sacrificial liner layer on the gate dielectric layer;
    depositing an amorphous semiconductor material on the sacrificial liner layer;
    depositing a second sacrificial liner layer on the amorphous semiconductor material;
    removing portions of the second sacrificial liner layer to expose portions of the amorphous semiconductor material;
    removing exposed portions of the amorphous semiconductor material;
    removing exposed portions of the second sacrificial liner layer;
    removing exposed portions of the gate dielectric layer;
    removing exposed portions of the second fin and a portion of the substrate exposed following the removal of the exposed portions of the second fin; and
    depositing an insulator material in the cavity.

11. The method of claim 10, further comprising performing a planarization process following the deposition of the insulator material in the cavity.

12. The method of claim 10, wherein the dielectric fill material includes an insulator material.

13. The method of claim 10, wherein the insulator layer includes an oxide material.

14. The method of claim 10, wherein the amorphous semiconductor material includes amorphous silicon.

15. The method of claim 10, wherein the second sacrificial liner layer includes a metallic material.

16. The method of claim 10, wherein the first fin and the second fin include semiconductor material.

17. The method of claim 10, further comprising removing exposed portions of the amorphous semiconductor material.

18. The method of claim 17, further comprising depositing a gate conductor material over channel regions of the first fin and the second fin.

19. A semiconductor device comprising:
    a first fin and a second fin arranged on a substrate;
    a gate stack arranged over a channel region of the first fin;
    spacers arranged along sidewalls of the gate stack;
    a cavity arranged adjacent to a distal end of the gate stack, the cavity defined by the substrate, a distal end of the second fin, and the spacers; and a dielectric fill material arranged in the cavity such that the dielectric fill material contacts the substrate, the distal end of the second fin, and the spacers.

20. The device of claim 19, wherein the dielectric fill material includes an insulator material.

\* \* \* \* \*